United States Patent
Hosoi et al.

(10) Patent No.: US 10,622,783 B1
(45) Date of Patent: Apr. 14, 2020

(54) THERMALLY-ASSISTED MAGNETIC RECORDING HEAD CAPABLE OF PREVENTING SOLDER OVERFLOW DURING MANUFACTURING

(71) Applicant: SAE Magnetics (H.K.) Ltd., Hong Kong (HK)

(72) Inventors: Ryo Hosoi, Hong Kong (HK); Takashi Honda, Hong Kong (HK); Makoto Kawato, Hong Kong (HK)

(73) Assignee: SAE MAGNETICS (H.K.) LTD., Hong Kong (HK)

( * ) Notice: Subject to any disclaimer, the term of this patent is extended or adjusted under 35 U.S.C. 154(b) by 0 days.

(21) Appl. No.: 16/266,118

(22) Filed: Feb. 4, 2019

(51) Int. Cl.
| | | |
|---|---|---|
| *G11B 11/105* | (2006.01) | |
| *H01S 5/022* | (2006.01) | |
| *G11B 5/02* | (2006.01) | |
| *G11B 5/105* | (2006.01) | |
| *G11B 5/00* | (2006.01) | |
| *G11B 5/60* | (2006.01) | |

(52) U.S. Cl.
CPC ............ *H01S 5/02236* (2013.01); *G11B 5/02* (2013.01); *G11B 5/105* (2013.01); *G11B 5/6088* (2013.01); *G11B 2005/0021* (2013.01)

(58) Field of Classification Search
None
See application file for complete search history.

(56) References Cited

U.S. PATENT DOCUMENTS

| | | | |
|---|---|---|---|
| 8,477,570 B2* | 7/2013 | Arai ................. | G11B 5/314 369/13.13 |
| 8,705,324 B2* | 4/2014 | Shivarama ............ | G11B 13/04 369/13.32 |
| 8,837,261 B1* | 9/2014 | Murata ................ | G11B 5/4866 360/264.2 |
| 9,025,423 B1* | 5/2015 | Naniwa ................. | G11B 5/105 369/13.13 |
| 9,830,937 B1* | 11/2017 | Hipwell, Jr. ......... | G11B 5/4826 |
| 9,966,093 B1* | 5/2018 | Naniwa ................ | G11B 5/4826 |
| 2011/0141862 A1* | 6/2011 | Arai ....................... | G11B 5/314 369/13.33 |
| 2011/0205661 A1 | 8/2011 | Komura et al. | |
| 2012/0008470 A1* | 1/2012 | Shimazawa ............ | G11B 5/314 369/13.24 |
| 2012/0155232 A1 | 6/2012 | Schreck et al. | |
| 2015/0154988 A1 | 6/2015 | Takei et al. | |
| 2015/0364899 A1 | 12/2015 | Tatah et al. | |
| 2015/0380035 A1 | 12/2015 | Takei et al. | |
| 2016/0322780 A1* | 11/2016 | Tani ..................... | H01S 5/02256 |

FOREIGN PATENT DOCUMENTS

JP  2012084216 A  4/2012

* cited by examiner

*Primary Examiner* — Tan X Dinh

(57) ABSTRACT

A light source-unit which is used for a thermally assisted magnetic head, comprises a laser diode and a sub-mount which the laser diode is joined. The sub-mount comprises a joint-surface which the laser diode is joined and a convex part protruding from the joint-surface. The light source-unit comprises an alloy layer, made of alloy, which is formed between the surface of the convex part and an opposing-surface, of the laser diode, opposing to the joint-surface.

15 Claims, 30 Drawing Sheets

THERMALLY-ASSISTED MAGNETIC RECORDING HEAD CAPABLE OF PREVENTING SOLDER OVERFLOW DURING MANUFACTURING

BACKGROUND

Field of the Invention

The present invention relates to a light source-unit, which is used for a thermally assisted magnetic head recording data on a magnetic recording medium by thermally assisted magnetic recording using near-field light, the thermally assisted magnetic head, a method of manufacturing the light source-unit, a head gimbal assembly and a hard disk drive each having the thermally assisted magnetic head.

Related Background Art

In recent years, as magnetic disk drives have been increasing their recording densities, thin-film magnetic heads recording data on a magnetic recording media have been required to further improve their performances. As the thin-film magnetic heads, those of composite type having a structure in which a reproducing head having a magnetoresistive device (hereinafter, referred to also as an "MR device") for read and a recording head having an electromagnetic coil device for write are laminated have been conventionally in wide use. In a magnetic disk drive, the thin-film magnetic head is provided on a slider which very slightly floats from the magnetic recording medium.

Incidentally, the magnetic disk drive records data by magnetizing magnetic fine particles on the magnetic recording medium using the recording head. In order to increase the recording density of the magnetic recording medium, it is effective to make the magnetic fine particles smaller.

When the magnetic fine particles are made smaller, however, there arises a problem that the magnetization thereof becomes unstable with respect to heat as the particles reduce in volume, thereby increasing the possibility that the data recorded on the magnetic recording medium is lost. To solve the problem, it is effective to increase the magnetic energy of the magnetic fine particles to thereby enhance the stability of magnetization. When the magnetic energy of the magnetic fine particles is increased, however, there arises another problem that the coercive force (difficulty in reversing magnetization) of the magnetic recording medium increases to deteriorate the data recording performance.

To solve such problems, a method called thermally assisted magnetic recording has been conventionally proposed. When recording data on a magnetic recording medium having a large coercive force, the thin-film magnetic head employing the thermally assisted magnetic recording (hereinafter, referred to as a "thermally assisted magnetic head") records data while instantaneously heating and thereby increasing the temperature of a portion of the magnetic recording medium where data will be recorded.

Since the magnetic fine particles decrease in coercive force when the temperature is increased, instantaneous heating makes it possible to record data even on the magnetic recording medium having a high coercive force at room temperature. The portion of the magnetic recording medium where the data has been recorded is decreased in temperature after the recording of data and thereby increases in coercive force. Therefore, by using the thermally assisted magnetic head, it becomes possible to make the magnetic fine particles finer as well as stabilize recording in the magnetic disk drive.

On the other hand, near-field light is used as means for heating the magnetic recording medium in the conventional thermally assisted magnetic head. When light enters an opening smaller than the wavelength of light, the light slightly seeps from the opening and locally exists near the opening. The light locally existing near the opening is called near-field light. The near-field light is confined in a region much smaller than that of a spot light obtained by collecting light using a lens, so that use of the near-field light makes it possible to heat only a limited extremely small recording region of the magnetic recording medium. A conventional technology concerning the thermally assisted magnetic recording is disclosed in, for example, US 2012-0155232 (also called patent document 1).

By the way, in the thermally assisted magnetic head, because the recording head is formed on the slider, the structure, which laser light for generating the near-field light is guided to the medium-opposing surface of the slider, is important. The following structure is conventionally known as the structure.

The structure which the light source is provided on the surface of the slider (for example, US2015-0364899 (also called patent document 2), US2011-0205661 (also called patent document 3), US2015-154988 (also called patent document 4), US 2015-0380035 (also called patent document 5), JP2012-084216 (also called patent document 6)).

SUMMARY OF THE INVENTION

There is a following problem in the thermally assisted magnetic head, having the above-described conventional structure.

When a laser diode as the light source is provided on the surface of the slider, a member, which is called a sub-mount, is used. For example, the sub-mount 300, as illustrated in FIG. 24, is used.

In this case, the laser diode 310 is joined to the surface 300a of the sub-mount 300 with solder 311. A circuit pattern 302 is formed on the surface 300a. Therefore, at first, solder 311 is applied to the circuit pattern 302. Next, as illustrated in FIG. 25 (A), the laser diode 310 is pushed on solder 311 by pushing device 312. On the occasion, because the sub-mount 300 is heated, as illustrated in FIG. 25 (B), a solder joint part 313, having alloy layer made of AuSn, is formed by a gold-plating layer 310a, the circuit pattern 302 and solder 311. In this way, as illustrated in FIG. 26, the light source-unit 315, having the sub-mount 300 and the laser diode 310, is formed.

However, because the bottom surface of the laser diode 310 is entirely pushed to solder 311, as illustrated in FIG. 27, solder 311 sometimes overflows from a side surface 300e of the sub-mount 300 to form an overflow-part 311A.

Further, as illustrated in FIG. 28, the overflow-part 311B of solder 311 is sometimes formed on the circuit pattern 302.

Therefore, when the light source-unit 315 is joined to a slider 320, for example, as illustrated in FIG. 29, the overflow-part 311A sometimes enters between the sub-mount 300 and the slider 320. Then, a gap between the laser diode 310 and the slider 320, illustrated in FIG. 29, is extended than the proper size.

Further, as illustrated in FIG. 30, when the light source-unit 315 is picked up by a suction apparatus 332, having a suction member 330 and a suction pipe 331, an edge part 333 of the suction member 330 sometimes is in contact with the overflow-part 311A. In this case, there is a possibility that the light source-unit 315 is not picked up.

Hence the present invention is made to solve the above problem, and it is an object to provide the light source-unit, not having the overflow of solder, when the laser diode is joined to the sub-mount, thermally assisted magnetic head having the light source-unit, a method of manufacturing the light source-unit, the head gimbal assembly and the hard disk drive.

To solve the above problem, the present invention is a light source-unit which is used for a thermally assisted magnetic head including: a laser diode; and a sub-mount which the laser diode is joined; the sub-mount includes a joint-surface which the laser diode is joined; and a convex part protruding from the joint-surface, the light source-unit includes an alloy layer, made of alloy, which is formed between the surface of the convex part and an opposing-surface, of the laser diode, opposing to the joint-surface.

In case of the above-described light source-unit, it is possible that the light source-unit further including: a laminated metals-layer formed between the joint-surface and the opposing-surface; the laminated metals-layer has a first metal-layer formed with alloy including tin and a second metal-layer formed with alloy which is different from the first metal-layer.

Further, it is possible that the convex part and the alloy layer has thickness in common with the laminated metals-layer.

Furthermore, it is possible that the sub-mount has plural convex parts, formed in a light source-area, of the joint-surface, which the laser diode is arranged, as the convex part, the laminated metals-layer is formed between each of the plural convex parts.

It is possible that each of the plural convex parts is arranged both sides of the light source-area along with the long side direction.

Further, it is possible that the plural convex parts are formed so that an add-up size, which the size of each convex part formed in the light source-area is added, is smaller than the size of the opposing-surface.

Further, it is possible that the alloy layer is made of AuSn alloy including Au and tin.

It is possible that the convex part is formed so that the surface is formed flat along with the joint-surface.

Further, the present invention provides a light source-unit which is used for a thermally assisted magnetic head including: a laser diode; and a sub-mount which the laser diode is joined; the sub-mount includes a joint-surface which the laser diode is joined; the laser diode includes an opposing-surface opposing to the joint-surface and a laser convex part protruding from the opposing surface, the light source-unit includes an alloy layer, made of alloy, which is formed between the surface of the laser convex part and the joint-surface of the sub-mount.

In case of the above-described thermally assisted magnetic head, it is possible that the laser convex part is formed in a light source-area, of the joint-surface, which the laser diode is arranged.

It is possible that the laser diode has plural laser convex parts, formed in the opposing-surface, as the laser convex part, the light source-unit further including: a laminated metals-layer formed between the joint-surface and the opposing-surface; the laminated metals-layer has a first metal-layer formed with alloy including tin and a second metal-layer formed with alloy which is different from the first metal-layer.

Then, the present invention provides a thermally assisted magnetic head including: a slider; and a light source-unit joined to the slider, the light source-unit includes a laser diode and a sub-mount which the laser diode is joined; the sub-mount includes a joint-surface which the laser diode is joined; and a convex part protruding from the joint-surface, the light source-unit includes an alloy layer, made of alloy, which is formed between the surface of the convex part and an opposing-surface, of the laser diode, opposing to the joint-surface.

Further, in case of the above-described thermally assisted magnetic head, it is possible that the light source-unit further including: a laminated metals-layer formed between the joint-surface and the opposing-surface; the laminated metals-layer has a first metal-layer formed with alloy including tin and a second metal-layer formed with alloy which is different from the first metal-layer.

Then, the present invention provides a method of manufacturing a light source-unit which is used for a thermally assisted magnetic head, the light source-unit is manufactured with a laser diode and a sub-mount; a convex part-mount is prepared, as the sub-mount; the convex part-mount includes a convex part, formed in a joint-surface which the laser diode is joined and protruding from the joint-surface; the method of manufacturing the light source-unit including: a first metal-layer forming step for forming a first metal-layer, which covers the convex part, in the joint-surface of the convex part-mount, so that a first concave part is secured outside the convex part; a second metal-layer forming step for forming a second metal-layer, made of metal being different from the first metal-layer, which covers the convex part on the first metal-layer, so that a second concave part is secured outside the convex part; a laser diode mounting step for mounting the laser diode on the second metal-layer so as to cover the convex part; and a heating-push step for pushing the laser diode with heating the convex part-mount.

In case of the above-described method of manufacturing the light source-unit, it is possible that the convex part-mount has plural convex parts, formed in the joint-surface, as the convex part, the first metal-layer forming step is performed so that the first concave part is secured between each of the plural convex parts, the second metal-layer forming step is performed so that the second concave part is secured between each of the plural convex parts.

Further, it is also possible that the heating-push step is performed so that an alloy layer is formed between the surface of the convex part and an opposing-surface, of the laser diode, opposing to the joint-surface.

Further, it is also possible that the first metal-layer forming step is performed so that tin is used as the first metal-layer, the second metal-layer forming step is performed so that gold is used as the second metal-layer.

Further, it is also possible that the heating-push step is performed so that a laminated metals-layer, having the first metal-layer and the second metal-layer and having thickness in common with the convex part and the alloy layer, is formed.

Then, the present invention provides a head gimbal assembly including a thermally assisted magnetic head, the thermally assisted magnetic head including: a slider; and a light source-unit joined to the slider, the light source-unit includes a laser diode and a sub-mount which the laser diode is joined; the sub-mount includes a joint-surface which the laser diode is joined; and a convex part protruding from the joint-surface, the light source-unit includes an alloy layer, made of alloy, which is formed between the surface of the convex part and an opposing-surface, of the laser diode, opposing to the joint-surface.

Then, the present invention provides a hard disk drive including a head gimbal assembly having a thermally assisted magnetic head, and a magnetic recording medium opposing the thermally assisted magnetic head, the thermally assisted magnetic head including: a slider; and a light source-unit joined to the slider, the light source-unit includes a laser diode and a sub-mount which the laser diode is joined; the sub-mount includes a joint-surface which the laser diode is joined; and a convex part protruding from the joint-surface, the light source-unit includes an alloy layer, made of alloy, which is formed between the surface of the convex part and an opposing-surface, of the laser diode, opposing to the joint-surface.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

Structure of the Thermally Assisted Magnetic Head

Figure 1:
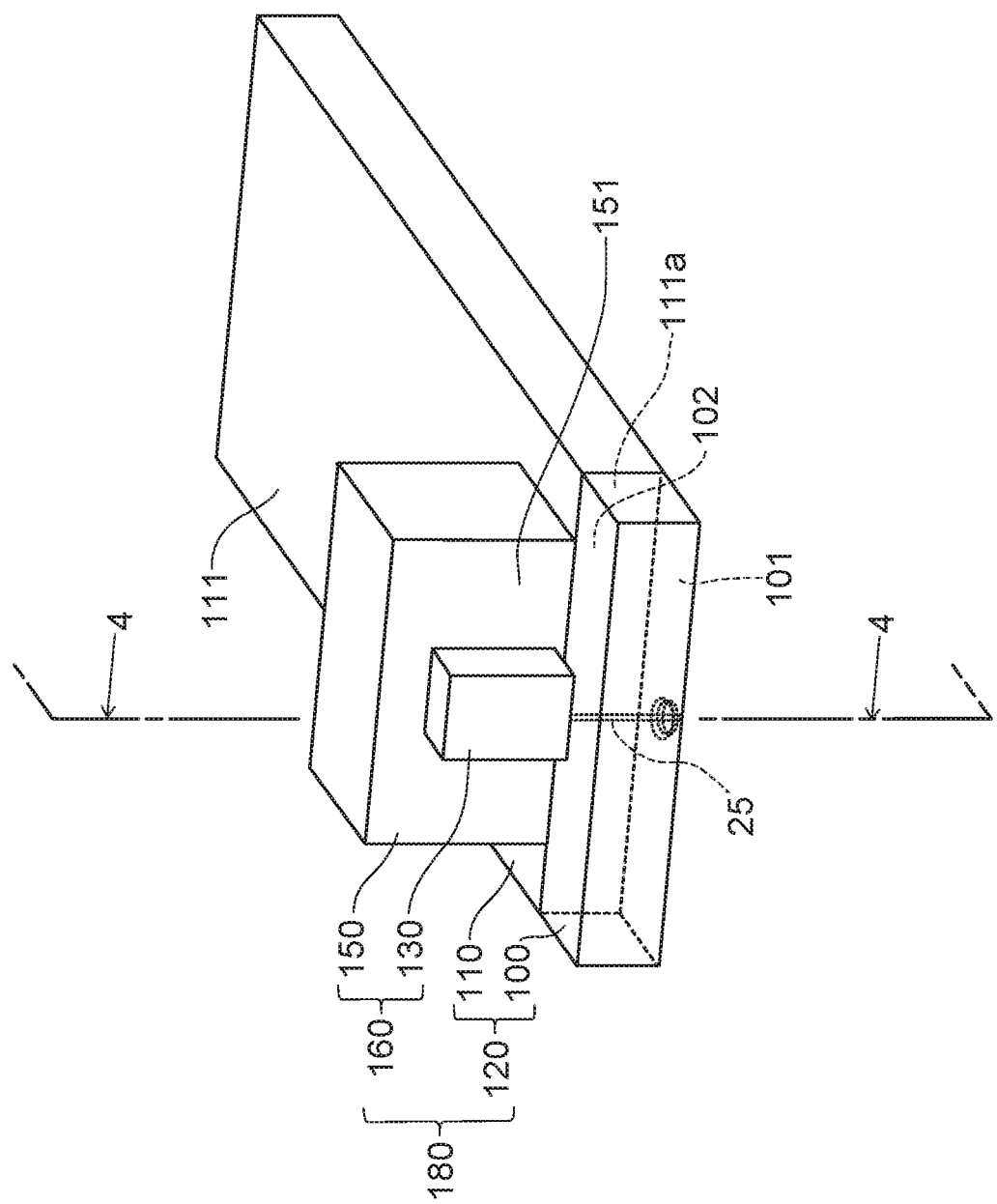
FIG. 1 is a perspective view of the thermally assisted magnetic head according to an embodiment of the present invention.
Figure 2:
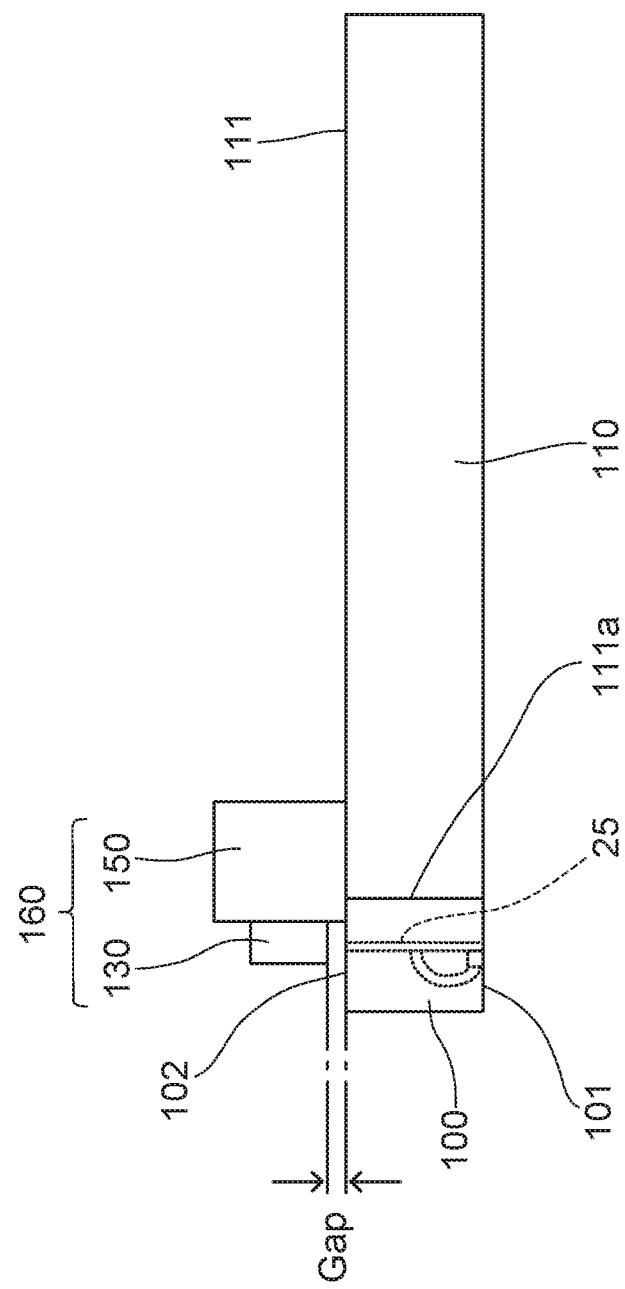
FIG. 2 is a side view of the thermally assisted magnetic head according to the embodiment of the present invention.
Figure 3:
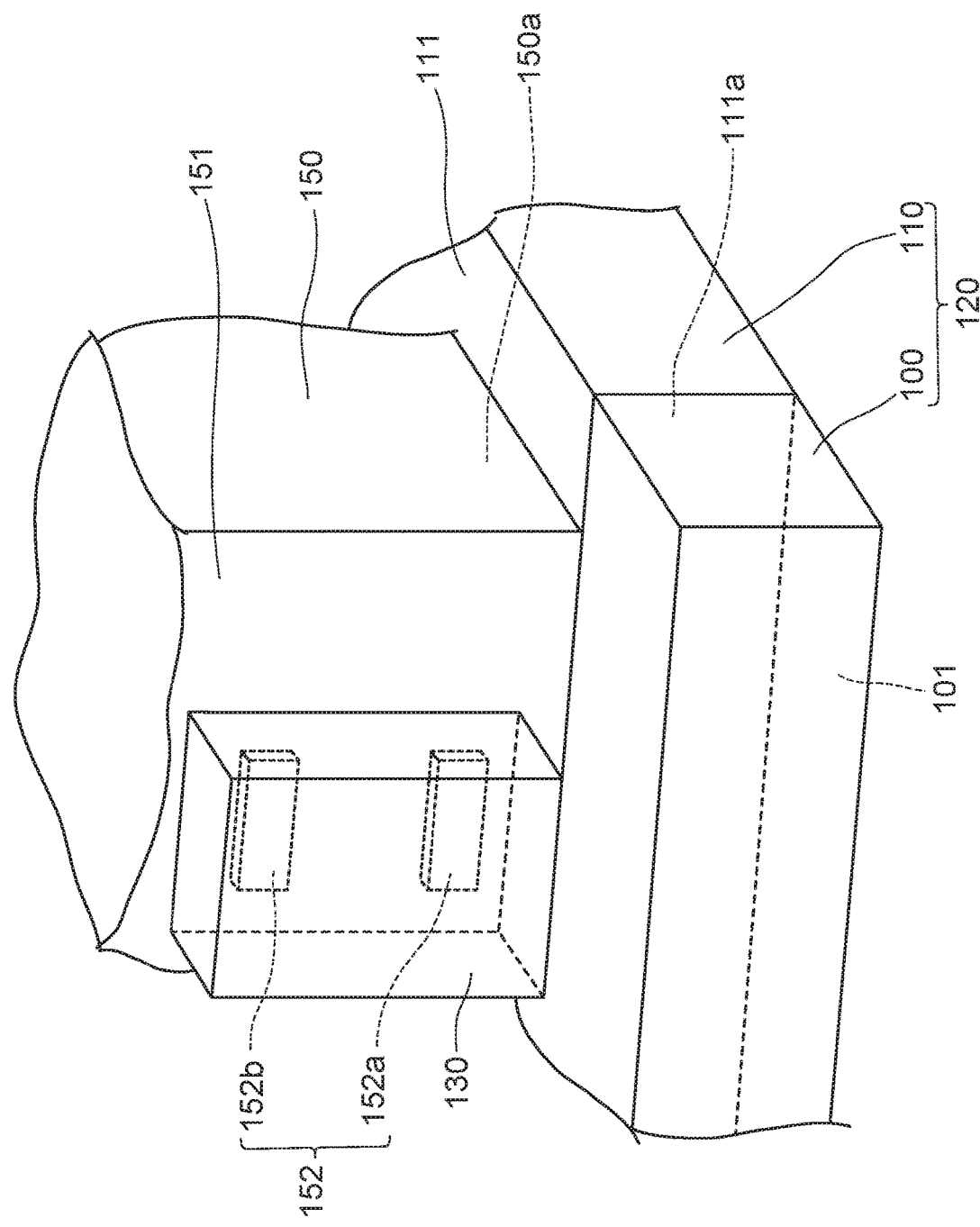
FIG. 3 is a perspective view, with enlargement, of the principal part of the thermally assisted magnetic head.
Figure 4:
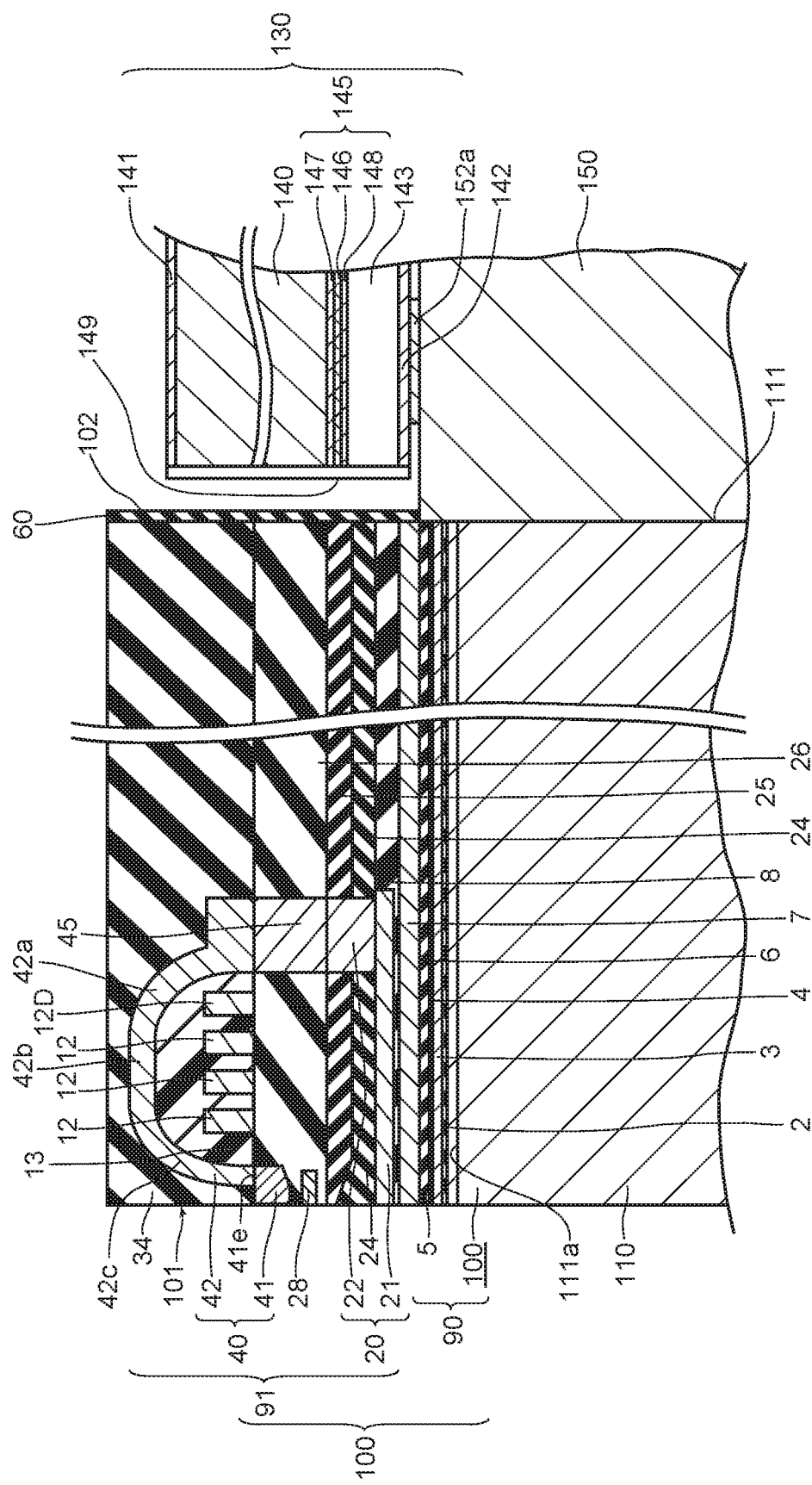
FIG. 4 is a sectional view of the principal part taken along the line 4-4 in FIG. 1.
Figure 5:
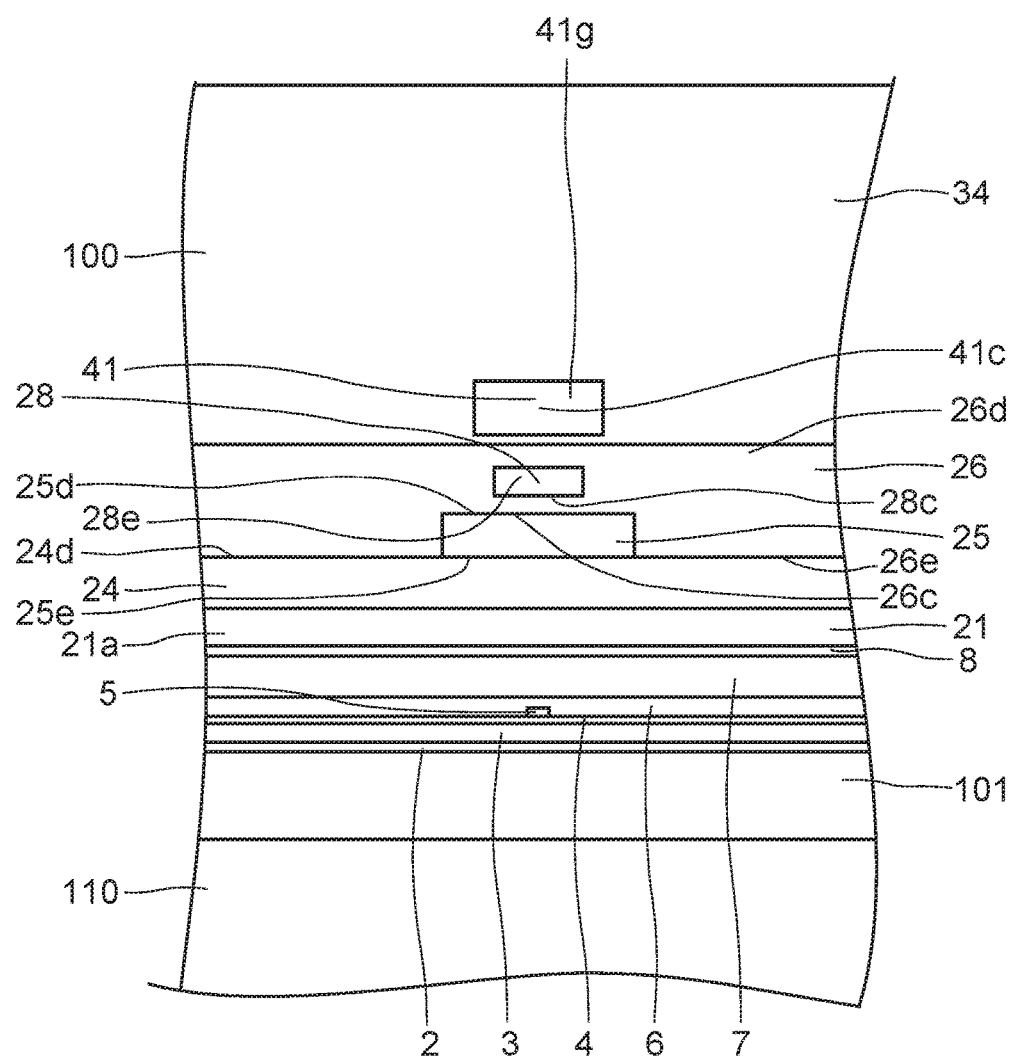
FIG. 5 is a front view, partially omitted, illustrating an air bearing surface of a magnetic head part.

To begin with, structure of the thermally assisted magnetic head according to the embodiment of the present invention will be explained with reference to FIG. 1 to FIG. 5. Here, FIG. 1 is a perspective view of the thermally assisted magnetic head 180 according to the embodiment of the present invention, FIG. 2 is a side view of the thermally assisted magnetic head 180 according to the embodiment of the present invention, FIG. 3 is a perspective view, with enlargement, of the principal part of the thermally assisted magnetic head 180. FIG. 4 is a sectional view of principal part taken along the line 4-4 in FIG. 1, FIG. 5 is a front view illustrating a medium opposing surface (Air Bearing Surface, which will hereinafter be referred also to as "ABS") 101 of the magnetic head part 100.

The thermally assisted magnetic head 180 has a slider 120 and a light source-unit 160 joined to the slider 120. The thermally assisted magnetic head 180 has a complex-slider-structure which the light source-unit 160 is joined to the slider 120.

The slider 120 has a slider-substrate 110 and the magnetic head part 100 formed on the slider-substrate 110.

The slider-substrate 110 is made of a ceramic material such as aluminum oxide-titanium carbide ($Al_2O_3$.TiC) or the like, and it is formed in a rectangular parallelepiped shape. The slider-substrate 110 has the ABS 101 as the medium opposing surface, opposing to the magnetic recording medium, a light source placing surface 111, arranged in the rear side of the ABS 101. A part, of the light source placing surface 111, of the magnetic head part 100 side is a light source-opposing surface 102. The light source-opposing surface 102 opposes to a later-described laser diode 130 of the light source-unit 160.

In the thermally assisted magnetic head 180, the light source-unit 160 is used. There is no overflow of solder, when the laser diode 130 is joined to a later-described sub-mount 150, in the light source-unit 160.

(Magnetic Head Part)

Subsequently, the magnetic head part 100 will be explained with mainly reference to FIG. 4 to FIG. 5. The magnetic head part 100 has a reproducing head 90 and a recording head 91. The magnetic head part 100 has a structure which the reproducing head 90 and the recording head 91 are stacked.

The reproducing head 90 has an MR device 5, arranged near the ABS 101, for detecting a magnetic signal. The reproducing head 90 comprises a lower shield layer 3, a lower shield gap film 4, an upper shield gap film 6 and an upper shield layer 7.

Then, an insulating layer 2 is further formed on a thin-film laminated surface 111a of the slider-substrate 110, and the lower shield layer 3 made of a magnetic material is formed on the insulating layer 2. Further, the lower shield gap film 4, as an insulating film, is formed on the lower shield layer 3, and the upper shield gap film 6 shielding the MR device 5 is formed on the lower shield gap film 4. The upper shield layer 7 made of a magnetic material is formed on the upper shield gap film 6, and an insulating layer 8 is formed on the upper shield layer 7.

The MR device 5 is constituted by a magnetosensitive film exhibiting a magnetoresistive effect, such as AMR (anisotropic magnetoresistive), GMR (giant magnetoresistive), and TMR (tunneling magnetoresistive) devices.

The recording head 91 has a thin-film coil 12, a return magnetic layer 20, a core layer 25, a lower dielectric-layer 24, an upper dielectric-layer 26, a near-field light generating layer 28, an overcoat layer 34, a main magnetic pole layer 40, and a linking magnetic pole layer 45, and has a structure in which they are stacked on the thin-film laminated surface 111a.

The thin-film coil 12 has four turn parts. The thin-film coil 12 is wound like a flat spiral about a later-described yoke magnetic pole layer 42 of the main magnetic pole layer 40.

The four turn parts are arranged at respective positions having different distances from the ABS 101. Among them, the turn part 12D is a part arranged at a position most distant from the ABS 101 among the four turn parts of the thin-film coil 12. The four turn parts are insulated from each other by a photoresist 13.

When a current modulated according to data to be recorded on the magnetic recording medium flows through the thin-film coil 12, the current causes the thin-film coil 12 to generate a recording magnetic field.

The return magnetic pole layer 20 has a connecting magnetic pole layer 21, and a rear magnetic pole layer 22. The connecting magnetic pole layer 21 has a magnetic pole end face 21a arranged within the ABS 101 and has a portion that is more distant from the ABS 101 than is the magnetic pole end face 21a being embedded in the insulating layer 8. The connecting magnetic pole layer 21 has a size reaching a position more distant from the ABS 101 than is the turn part 12D. To the connecting magnetic pole layer 21, the rear magnetic pole layer 22 is joined at a position more distant from the ABS 101 than is the turn part 12D.

The rear magnetic pole layer 22 is arranged at a position more distant from the ABS 101 than is the turn part 12D, and it is joined to the connecting magnetic pole layer 21 and the later-described linking magnetic pole layer 45.

The return magnetic pole layer 20 is provided to return a magnetic flux to the main magnetic pole layer 40. When a magnetic flux generated by the recording magnetic field is emitted from a later-described magnetic pole end face 41g of the main magnetic pole layer 40 to the magnetic recording medium, the magnetic flux flows back to the return magnetic pole layer 20 via the magnetic recording medium (a not-depicted soft magnetic layer in detail). This magnetic flux passes through the linking magnetic pole layer 45 and reaches the main magnetic pole layer 40.

The core layer 25 is a wave guide which guides laser light, generated by the later-described laser diode 130 of the light source-unit 160, from the light source-opposing surface 102 to the ABS 101. The core layer 25, as illustrated in FIG. 4, is formed along with a depth direction, passing through between the linking magnetic pole layer 45, from the ABS 101 to the light source-opposing surface 102.

The core layer 25 is formed with dielectric such as tantalum oxide ($TaO_x$) or the like. For example, the core layer 25 is able to be formed with $Ta_2O_5$ (for example, the refractive index is about 2.16).

The core layer 25 is formed so as to be accommodated in a later-described concave part 26c of the upper dielectric-layer 26, on an upper surface 24d of the lower dielectric-layer 24. Further, an upper surface 25d and both side surfaces, of the core layer 25, are in contact with the upper dielectric-layer 26, and a lower surface 25e, of the core layer 25, is in contact with the lower dielectric-layer 24.

Then, the upper dielectric-layer 26 and the lower dielectric-layer 24 are arranged in the surrounding of the core layer 25, the cladding layer is constituted by the upper dielectric-layer 26 and the lower dielectric-layer 24.

The upper dielectric-layer 26 is formed in a substantially flat plate shape having a width larger than the width of the magnetic pole end part layer 41. The upper dielectric-layer 26 is formed with dielectric, having the lower refractive index than the core layer 25, for example, such as aluminum oxide ($AlO_x$) or the like. For example, the upper dielectric-layer 26 is able to be formed with alumina ($Al_2O_3$, for example, the refractive index is about 1.63). Then, the concave part 26c is formed on the lower surface 26e of the upper dielectric-layer 26, the core layer 25 is accommodated in the concave part 26c.

The lower dielectric-layer 24 is formed so as to be in contact with the lower surface 25e of the core layer 25 and the lower surface 26e of the upper dielectric-layer 26. The lower dielectric-layer 24 is able to be formed with dielectric such as aluminum oxide ($AlO_x$) or the like, similar with the upper dielectric-layer 26.

For example, the lower dielectric-layer 24 is able to be formed with alumina ($Al_2O_3$).

The near-field light generating layer 28 has a structure formed in a rectangular shape as a whole, seen from the ABS 101.

The near-field light generating layer 28 is made of metal and formed of, for example, one of Au, Ag, Al, Cu, Pd, Pt, Rh, Ir or an alloy made of a plurality of those elements.

The near-field light generating layer 28 has a bottom part 28c. The bottom part 28c is arranged at the deepest positions of the near-field light generating layer 28. The bottom part 28c extends from the ABS 101 in the depth direction. The end surface of the bottom part 28c on the ABS 101 side is arranged within the ABS 101. This end surface is a generating end part 28e. The generating end part 28e generates near-field light for heating the magnetic recording medium.

The main magnetic pole layer 40 has the magnetic pole end part layer 41 and the yoke magnetic pole layer 42. The magnetic pole end part layer 41 and the yoke magnetic pole layer 42 have a symmetrical structure formed to be bilaterally symmetrical about an front end part 41c.

The front surface including the front end part 41c constitutes the magnetic pole end surface 41g. The magnetic pole end surface 41g is arranged within the ABS 101. The yoke magnetic pole layer 42 is joined to an upper surface 41e of the magnetic pole end part layer 41.

The yoke magnetic pole layer 42 has a rear magnetic pole layer 42a, a middle magnetic pole layer 42b, and a front magnetic pole layer 42c. The yoke magnetic pole layer 42 has a curved structure extending from the ABS 101 in the depth direction and leading to the linking magnetic pole layer 45 straddling the thin-film coil 12.

The rear magnetic pole layer 42a is arranged at a position more distant from the ABS 101 than are the four turn parts of the thin-film coil 12. The rear magnetic pole layer 42a has a lateral width larger than that of the middle magnetic pole layer 42b (the largest lateral width in the yoke magnetic pole layer 42) and is joined to the linking magnetic pole layer 45. The middle magnetic pole layer 42b is arranged above the thin-film coil 12. The middle magnetic pole layer 42b is connected to the rear magnetic pole layer 42a and the front magnetic pole layer 42c. The middle magnetic pole layer 42b has a lateral width gradually getting smaller as it approaches to the ABS 101. The front magnetic pole layer 42c is formed in a downward curved structure getting closer to the magnetic pole end part layer 41 as it approaches to the ABS 101. The front magnetic pole layer 42c is joined to the surface 41e of the magnetic pole end part layer 41.

The linking magnetic pole layer 45 is arranged in a manner to hold the core layer 25 from both right and left sides at a position more distant from the ABS 101 than is the thin-film coil 12. Further, the linking magnetic pole layer 45 is joined to the rear magnetic pole layer 22. The linking magnetic pole layer 45 magnetically links the return magnetic pole layer 20 to the main magnetic pole layer 40, and has a role of returning, to the main magnetic pole layer 40, the magnetic flux flown back to the return magnetic pole layer 20.

(Light Source-Unit)

Figure 6:
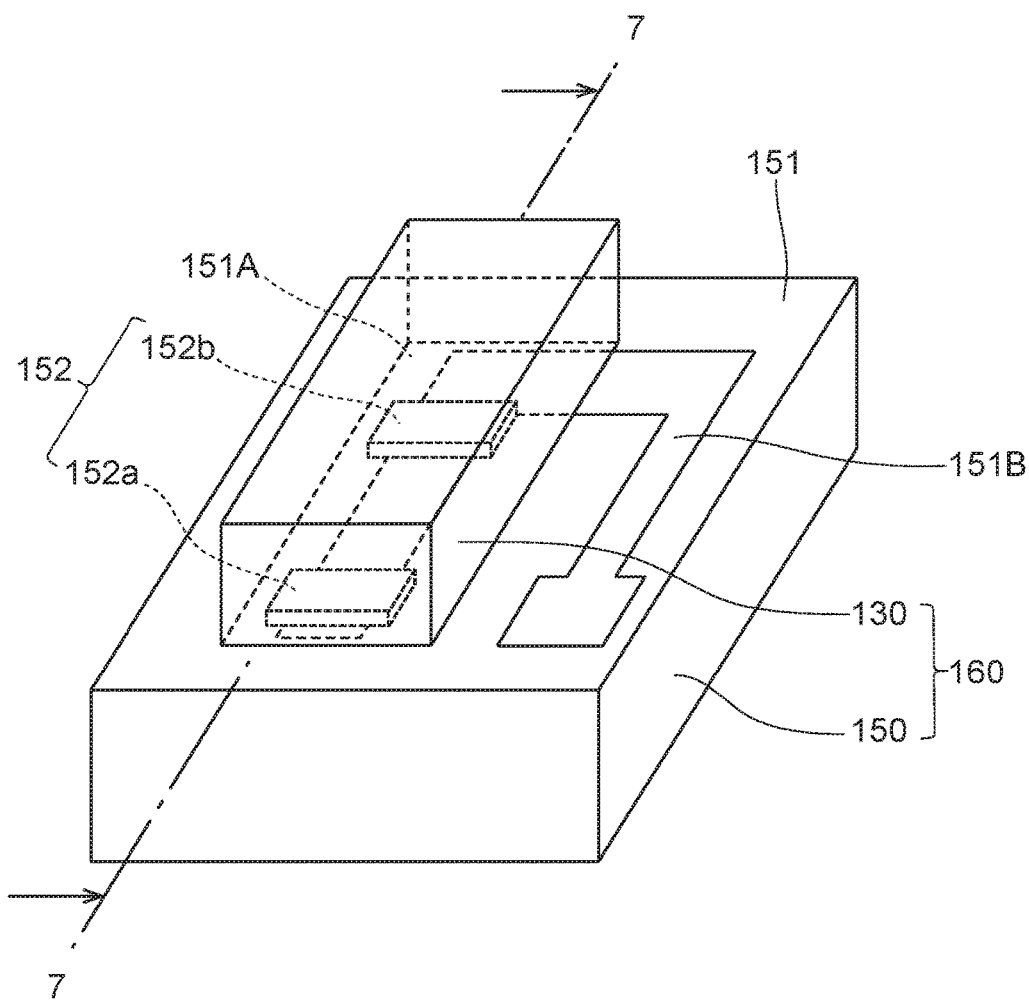
FIG. 6 is a perspective view showing a light source-unit which is used for the thermally assisted magnetic head.
Figure 7:
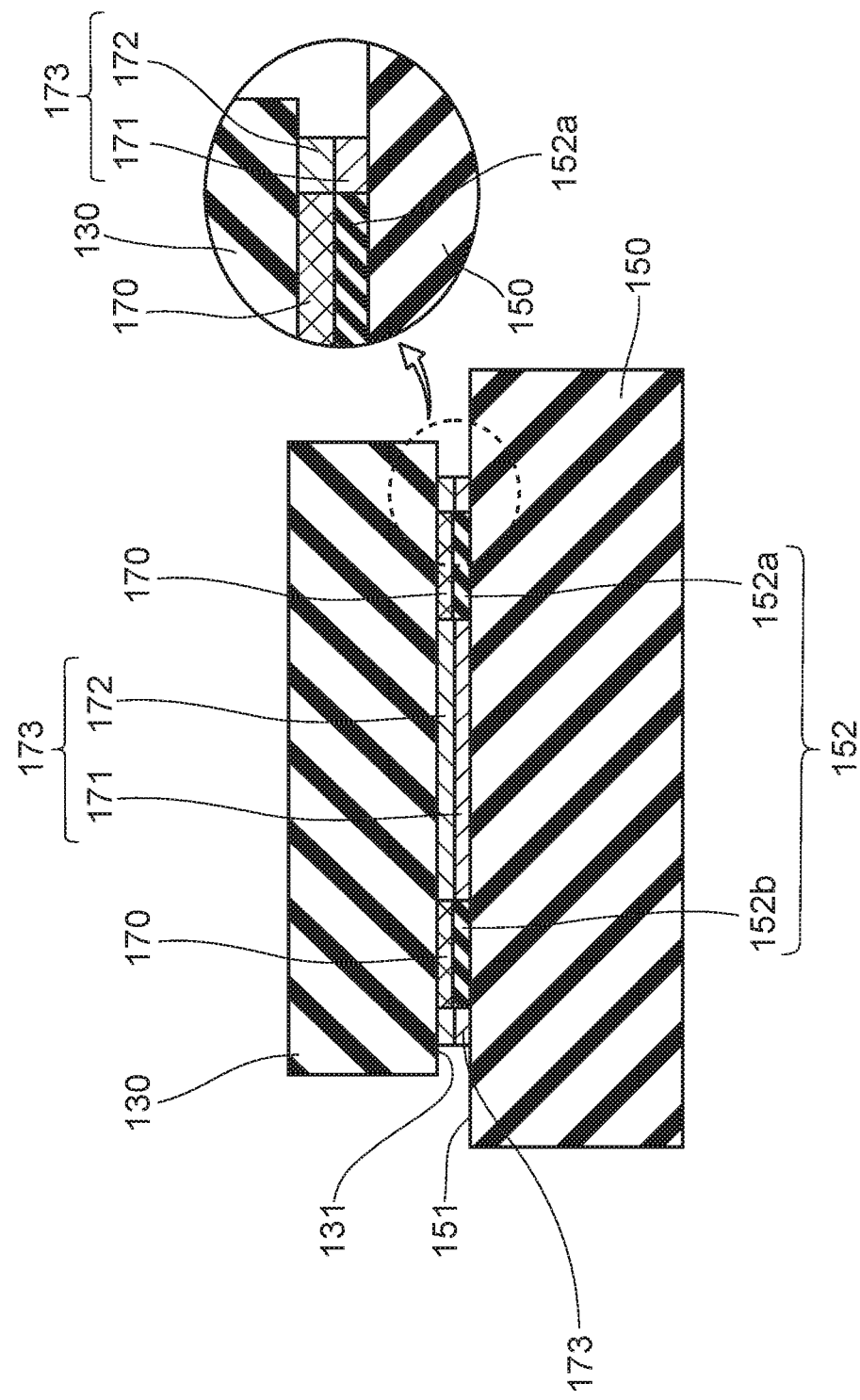
FIG. 7 is a sectional view taken along the line 7-7 in FIG. 6.
Figure 8:
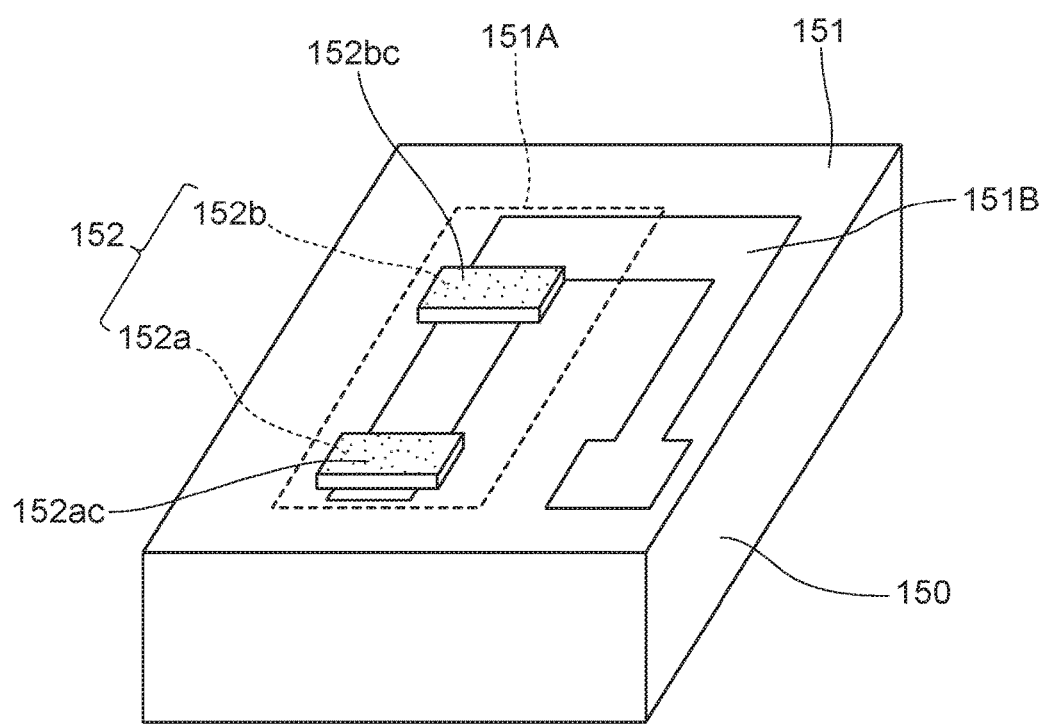
FIG. 8 is a perspective view showing the sub-mount.
Figure 9:
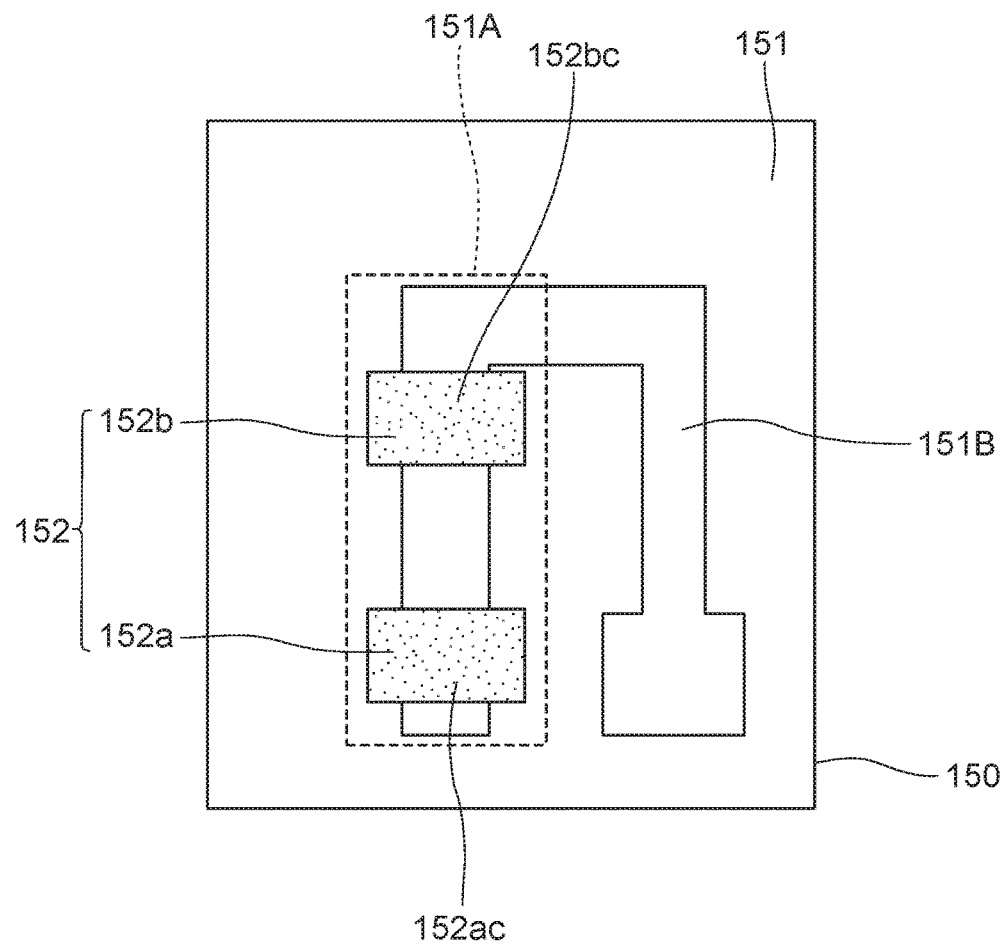
FIG. 9 is a plan view showing the sub-mount.
Figure 10:
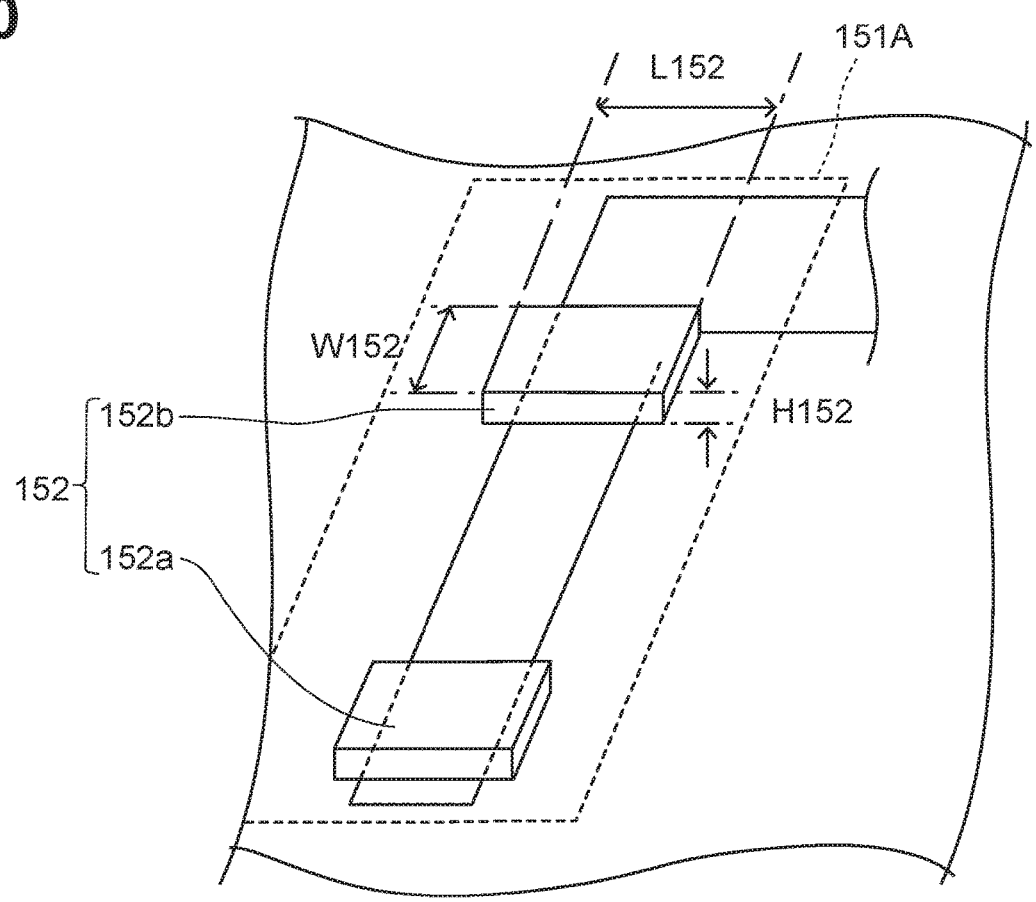
FIG. 10 is a perspective view, with enlargement, showing the principal part of the sub-mount.

Subsequently, the light source-unit 160 will be explained with reference to FIG. 6 to FIG. 10, in addition to FIG. 1 to FIG. 5. FIG. 6 is a perspective view showing the light source-unit 160 which is used for the thermally assisted magnetic head 180, FIG. 7 is a sectional view taken along the line 7-7 in FIG. 6. FIG. 8 is a perspective view showing the sub-mount 150, FIG. 9 is a plan view showing the sub-mount 150, FIG. 10 is a perspective view, with enlargement, showing the principal part of the sub-mount 150.

The light source-unit 160 has the laser diode 130 and the sub-mount 150. The laser diode 130 is joined to the sub-mount 150 to constitute the light source-unit 160.

As illustrated in FIG. 4, the laser diode 130 has an n-substrate 140, an n-electrode 141, a light emitting layer 145, and a p-electrode 142, and has a rectangle parallelepiped shape. In addition, the n-electrode 141 is joined to a surface on the outside of the n-substrate 140. Further, the light emitting layer 145 is formed on a side of the n-substrate 140 opposite to the n-electrode 141, and the p-electrode 142 is joined on the light emitting layer 145, via a ground layer 143.

The light emitting layer 145 has an active layer 146, an n-cladding layer 147, and a p-cladding layer 148, and has a structure in which the active layer 146 is sandwiched between the n-cladding layer 147 and the p-cladding layer 148.

Then, the laser diode 130 is joined to the sub-mount 150 so that the active layer 146 opposes to the core layer 25, and an emitting part 149 is arranged in a part, of the light emitting layer 145, opposing to the core layer 25. The emitting part 149 is a part, of the laser diode 130, which emits the laser light.

The sub-mount 150 is made of a ceramic material such as aluminum oxide-titanium carbide ($Al_2O_3 \cdot TiC$) or the like, and it is formed in a rectangular parallelepiped shape. The sub-mount 150 has a size larger than the laser diode 130. Further, the sub-mount 150 is able to be formed with semiconductor material such as Si, GaAs, SiC or the like.

Then, as illustrated in detail in FIG. 3, FIG. 6 to FIG. 9, the sub-mount 150 has a joint-surface 151, which the laser diode 130 is joined. The joint-surface 151 is formed in a flat rectangular shape. The joint-surface 151 has a size larger than a later-described opposing-surface 131 of the laser diode 130.

Further, two convex parts 152 (convex parts 152a, 152b) are formed on a light source-area 151A of the joint-surface 151. The light source-area 151A is a part, of the joint-surface 151, which the laser diode 130 is arranged (a rectangular part with broken line in FIG. 8 to FIG. 10).

The convex parts 152 (convex parts 152a, 152b) are parts protruding outside from the joint-surface 151. The convex parts 152 (convex parts 152a, 152b) are, as illustrated in FIG. 10, formed by a rectangular shape, in a plan view, having length (L152) in a long side direction, width (W152) in a short side direction and a thickness (H152).

The surfaces 152ac, 152bc (part with dots in FIG. 8, FIG. 9) of the convex parts 152a, 152b are formed in a flat rectangular shape along with the joint-surface 151. Further, the convex parts 152a, 152b are formed so that the size which both sizes are added up (an add-up size of sizes of the surfaces 152ac, 152bc) is smaller than the size of the opposing-surface 131.

The convex parts 152 (convex parts 152a, 152b) are arranged, on the circuit pattern 151B, both sides of the light source-area 151A along with the long-side direction.

The convex parts 152 (convex parts 152a, 152b) are able to be formed with, for example, AlOx, SiOx, W (tungsten), Pt and so on.

Then, the laser diode 130 is joined to the light source-area 151A of the joint-surface 151 so that the opposing-surface 131 is arranged on the convex parts 152 (convex parts 152a, 152b).

In this case, as illustrated in FIG. 7, an alloy layer 170 is formed between the opposing-surface 131 of the laser diode 130 and surfaces 152ac, 152bc of the convex parts 152a, 152b. Further, a laminated metals-layer 173 is formed between the opposing-surface 131 and the joint-surface 151. The laminated metals-layer 173 is formed on the part between the convex part 152a and the convex part 152b, the part outside the convex part 152a, and the part outside the convex part 152b.

The opposing-surface 131 is a surface, of the laser diode 130, opposing to the joint-surface 151. The opposing-surface 131 has the size smaller than the joint-surface 151, and it is formed in a flat rectangular shape.

The alloy layer 170 is made of alloy, including tin and gold (AuSn alloy).

The laminated metals-layer 173 has a first metal-layer 171 and a second metal-layer 172. The first metal-layer 171 is formed on the joint-surface 151, the second metal-layer 172 is formed on the first metal-layer 171.

The first metal-layer 171 is formed with metal including tin (for example, Sn—Ag—Cu solder and so on). The second metal-layer 172 is formed with metal (for example, Au) which is different from the first metal-layer 171.

The sub-mount 150 of the light source-unit 160, having the above-described structure, is joined to the slider 120 to constitute the thermally assisted magnetic head 180.

(Method of Manufacturing the Light Source-Unit)

Figure 11:
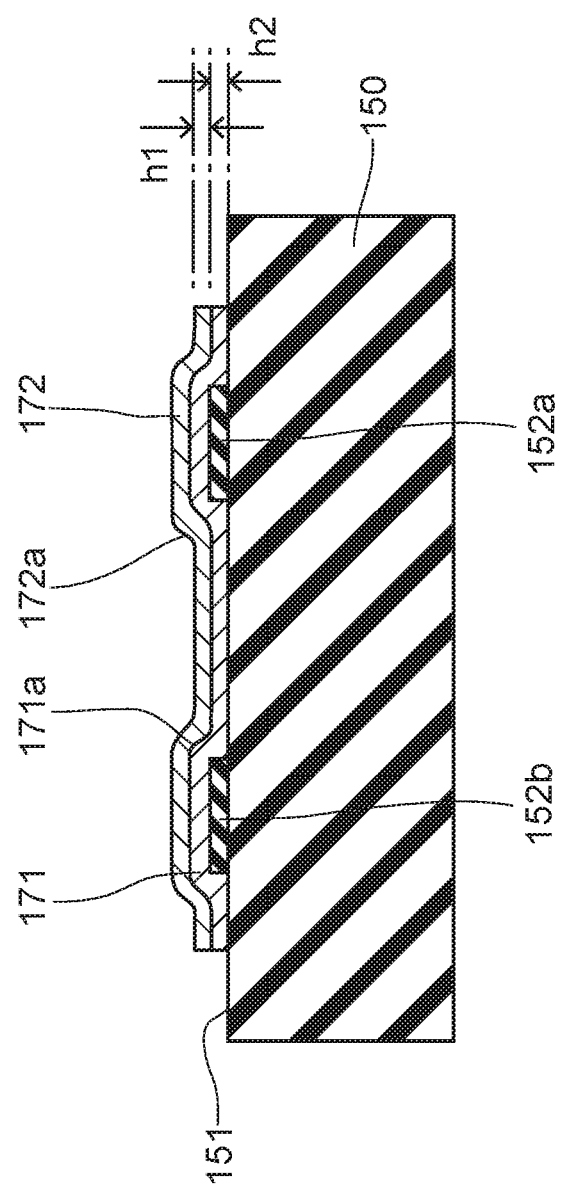
FIG. 11 is a sectional view, similar to FIG. 7, illustrating a manufacturing step of the light source-unit.
Figure 12:
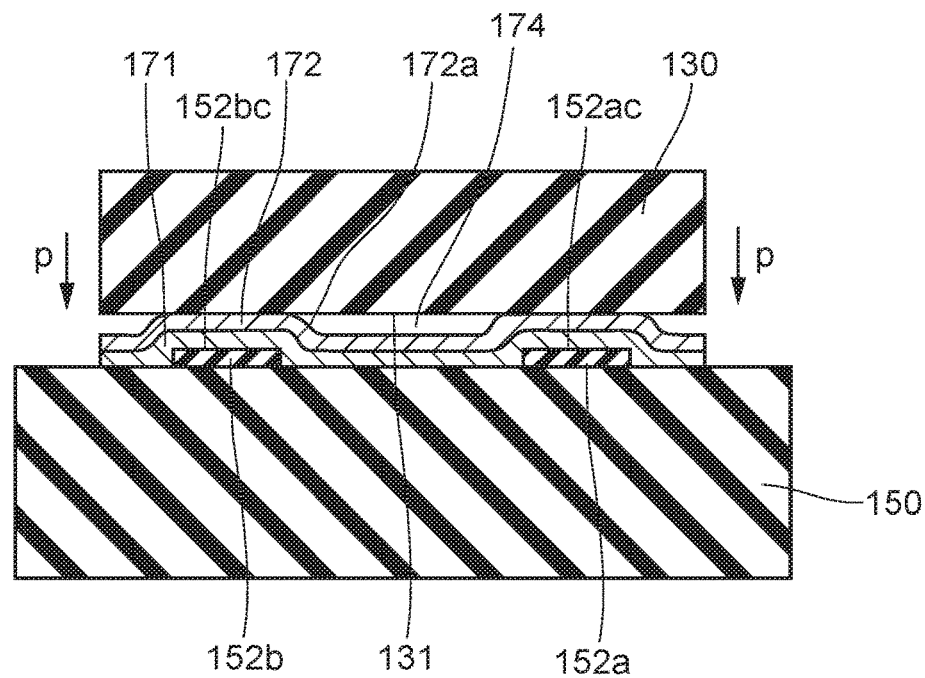
FIG. 12 is a sectional view, similar to FIG. 7, illustrating the manufacturing step subsequent to that in FIG. 11.
Figure 13:
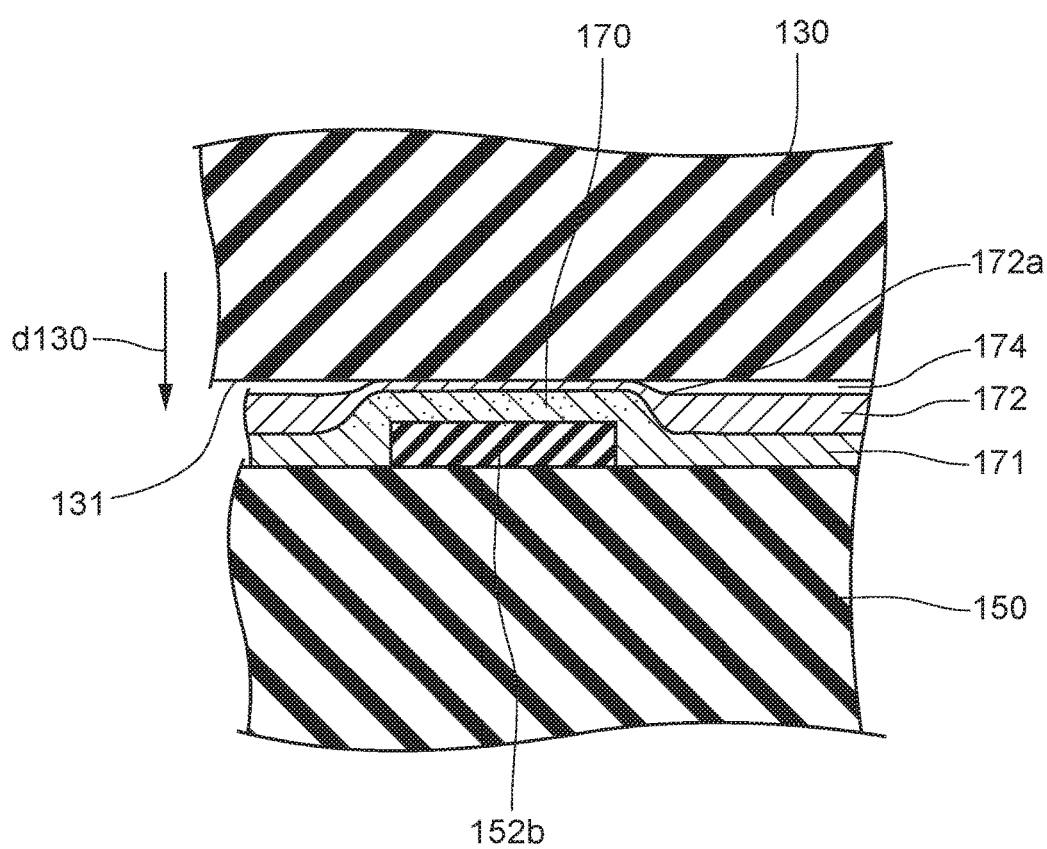
FIG. 13 is a sectional view, similar to FIG. 7, illustrating the manufacturing step subsequent to that in FIG. 12.

Subsequently, method of manufacturing the light source-unit 160 will be explained with reference to FIG. 11 to FIG. 13. FIG. 11 is a sectional view, similar to FIG. 7, illustrating a manufacturing step of the light source-unit 160. FIG. 12 is a sectional view, similar to FIG. 7, illustrating the manufacturing step subsequent to that in FIG. 11. FIG. 13 is a sectional view, similar to FIG. 7, illustrating the manufacturing step subsequent to that in FIG. 12.

The light source-unit 160 is manufactured with the laser diode 130 and the sub-mount 150. Then, the sub-mount 150, of this case, is a convex part-mount. The convex part-mount is the sub-mount which a convex part (for example, the above-described convex parts 152a, 152b) is formed on the light source-area 151A of the joint-surface 151 (for example, the above-described the sub-mount 150).

Then, the light source-unit 160 is manufactured by performing a first metal-layer forming step, a second metal-layer forming step, a laser diode mounting step and a heating-push step.

In the first metal-layer forming step, as illustrated in FIG. 11, the first metal-layer 171 is formed with deposition of the first metal. In this case, for example, metal including tin (for example, Sn—Ag—Cu solder and so on) is used as the first metal.

The first metal-layer 171 is formed in the light source-area 151A of the joint-surface 151 so that it covers the convex parts 152a, 152b and a first concave part 171a is secured outside the convex parts 152a, 152b.

In this case, because the plural convex parts 152a, 152b are formed on the joint-surface 151, the first concave part 171a is secured between the convex part 152a and the convex part 152b. Because the convex parts 152a, 152b exist on the joint-surface 151, parts of the first metal-layer 171, stacked on the convex parts 152a, 152b, protrude outside (upper side in FIG. 11) than the other part to secure the first concave part 171a.

Next, the second metal-layer forming step is performed. In the second metal-layer forming step, as illustrated in FIG. 11, the second metal-layer 172 is formed with deposition of the second metal. In this case, for example, the second metal is metal which is different from the first metal, for example, Au (gold) is used as the second metal.

The second metal-layer 172 is formed in the light source-area 151A of the joint-surface 151 so that it covers the convex parts 152a, 152b and a second concave part 172a is secured outside the convex parts 152a, 152b.

In this case, the second concave part 172a is secured between the convex part 152a and the convex part 152b, similar to the first concave part 171a. Further, parts of the second metal-layer 172, stacked on the convex parts 152a, 152b, protrude outside (upper side in FIG. 11) than the other part to secure the second concave part 172a.

Subsequently, the laser diode mounting step is performed. In this step, as illustrated in FIG. 12, the laser diode 130 is mounted on the second metal layer 172 so as to cover the convex parts 152a, 152b. Then, because the first, second concave parts 171a, 172a are secured between the convex part 152a and the convex part 152b, a gap part 174 is formed between the opposing-surface 131 of the laser diode 130 and the second concave part 172a.

After that, the heating-push step is performed. In the heating-push step, the sub-mount 150 is heated by a heater (not illustrated).

Further, as illustrated in FIG. 13, during the heating, the laser diode 130 is pushed by the pressure P of the pushing device, not illustrated in FIG. 13, along with the arrow d130 direction.

Then, because the first metal-layer 171 is melt by heating of the sub-mount 150, alloy (for example AuSn alloy), made of the melted first metal-layer 171 and the second metal-layer 172, is formed. Therefore, the alloy layer 170, made of the alloy, is formed between the surface 152ac, 152bc of the convex parts 152a, 152b and the opposing-surface 131, by performing the heating-push step.

In this case, the first concave part 171a, second concave part 172a are secured between the convex part 152a and the convex part 152b. Therefore, the opposing-surface 131 of the laser diode 130 is in contact with the second metal-layer 172, arranged in the upper side of the convex parts 152a, 152b though, it is not contact with the other part of the second metal-layer 172 (part, of the second metal-layer 172, between the convex part 152a and the convex part 152b and so on). Therefore, parts of the first, second metal-layers 171, 172, arranged in the upper sides of the convex parts 152a, 152b, are pressed though, the other part is not pressed.

Then, parts, of the first, second metal-layers 171, 172 arranged in the upper side of the convex parts 152a, 152b, are pressed by the heating-push step.

Therefore, part of the first, second metal-layers 171, 172, arranged between the surfaces 152ac, 152bc of the convex parts 152a, 152b and the opposing-surface 131, are partially pushed outside the convex parts 152a, 152b. The alloy layer 170, made of alloy remained after performing the heating-push step, is formed. The alloy layer 170 is formed with, for example, AuSn alloy.

In solder junction, made of solder including mainly tin, an alloy layer made of alloy is formed in an interface between the basic material and solder. Members made of metal is firmly joined by forming the alloy layer in the interface.

The alloy layer 170 is formed between the respective surfaces 152ac, 152bc of the convex parts 152a, 152b and the opposing-surface 131 though, the alloy layer 170 includes tin, similar to the solder junction. Therefore, the firm junction, similar to the solder junction, is realized by the alloy layer 170. In the light source-unit 160, the laser diode 130 is joined firmly to the sub-mount 150.

(Operation and Effect of the Light Source-Unit)

As described above, the laser diode 130 is joined to the sub-mount 150 to manufacture the light source-unit 160. As described above, the sub-mount 150 is a convex part-mount, the laser diode 130 is joined to the joint-surface 151. The convex parts 152a, 152b are formed on the joint-surface 151, thereby the first, second concave parts 171a, 172a are secured before the sub-mount 150 is joined to the laser diode 130. Therefore, when the laser diode 130 is pressed, parts of the first, second metal-layers 171, 172, arranged in the upper side of the convex parts 152a, 152b are pressed though, the other part is not pressed.

Accordingly, part being pressed by the heating-push step is limited in parts of the first, second metal-layers 171, 172. Therefore, when the laser diode 130 is joined to the sub-mount 150, overflow of the melted solder (the first metal-layer 171, in this embodiment) does not occur. Accordingly, there is no overflow of solder, when the laser diode 130 is joined to the sub-mount 150, in the light source-unit 160.

Further, because the thermally assisted magnetic head 180 is manufactured using the above-described light source-unit 160, extension of the gap (distance between the laser diode 130 and the slider 120), by overflow of solder, never occurs. Further, a pick-up failure, concerning the light source-unit 160 in the manufacturing step, also never occurs. Accordingly, the thermally assisted magnetic head 180 is manufactured effectively.

Further, the alloy layer 170 is made of AuSn alloy. Because the melting point of AuSn alloy is higher than tin, namely the first metal-layer 171, the laser diode 130 is more firmly joined to the sub-mount 150.

Furthermore, because the surfaces 152ac, 152bc of the convex parts 152a, 152b are formed flat, the alloy layer 170 is in contact with the whole of the surfaces 152ac, 152bc uniformly. Therefore, the sub-mount 150 is more firmly joined to the laser diode 130 by the alloy layer 170.

Modified Example 1

Figure 14:
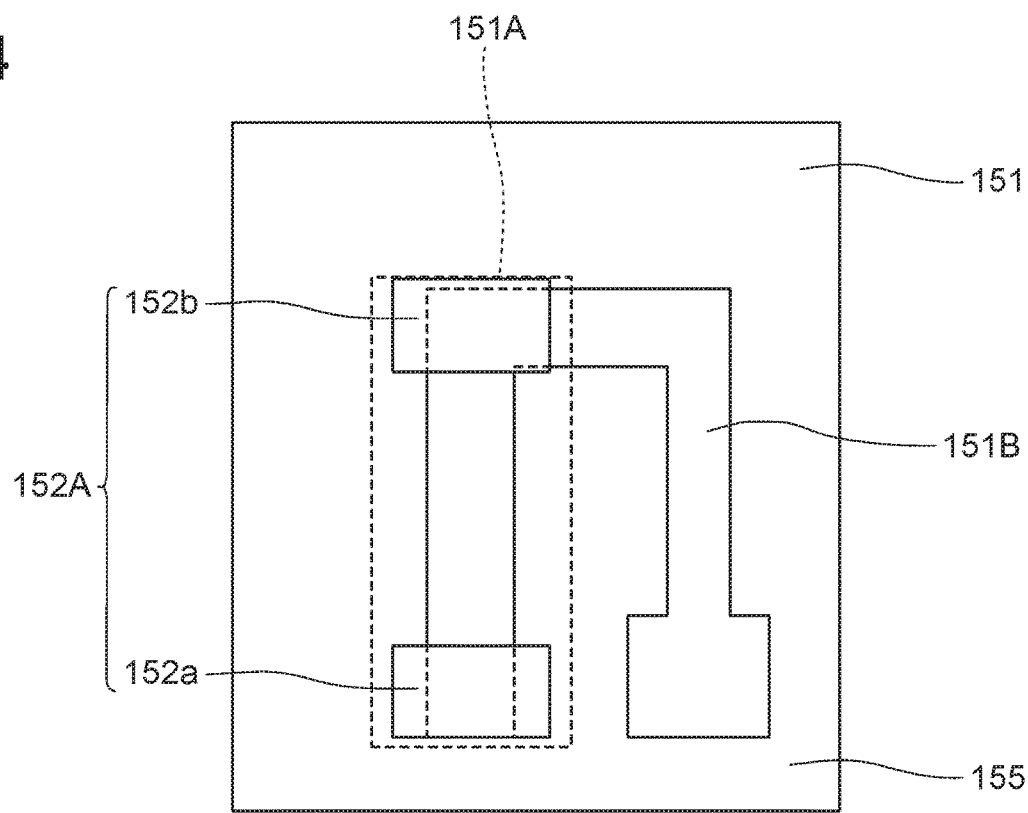
FIG. 14 is a plan view showing the sub-mount according to a modified example 1.

FIG. 14 is a plan view showing the sub-mount 155 according to the modified example 1. The sub-mount 155 is different in that it has the convex parts 152A instead of the convex parts 152, as compared with the above-described the sub-mount 150. The two convex parts 152a, 152b are assigned to the convex parts 152A, similar to the convex parts 152. However, in case of the convex parts 152A, the convex parts 152a, 152b are arranged respectively both end parts along with the long side direction of the light source-area 151A. Because the convex parts 152a, 152b, as the convex parts 152A, are also arranged in the light source-area 151A, only some parts of the first, second metal-layers 171, 172 are pressed in the heating-push step, similar to the case which the sub-mount 150 is used. Therefore, overflow of the melted solder (the first metal-layer 171, in this embodiment) does not occur.

Modified Example 2

Figure 15:
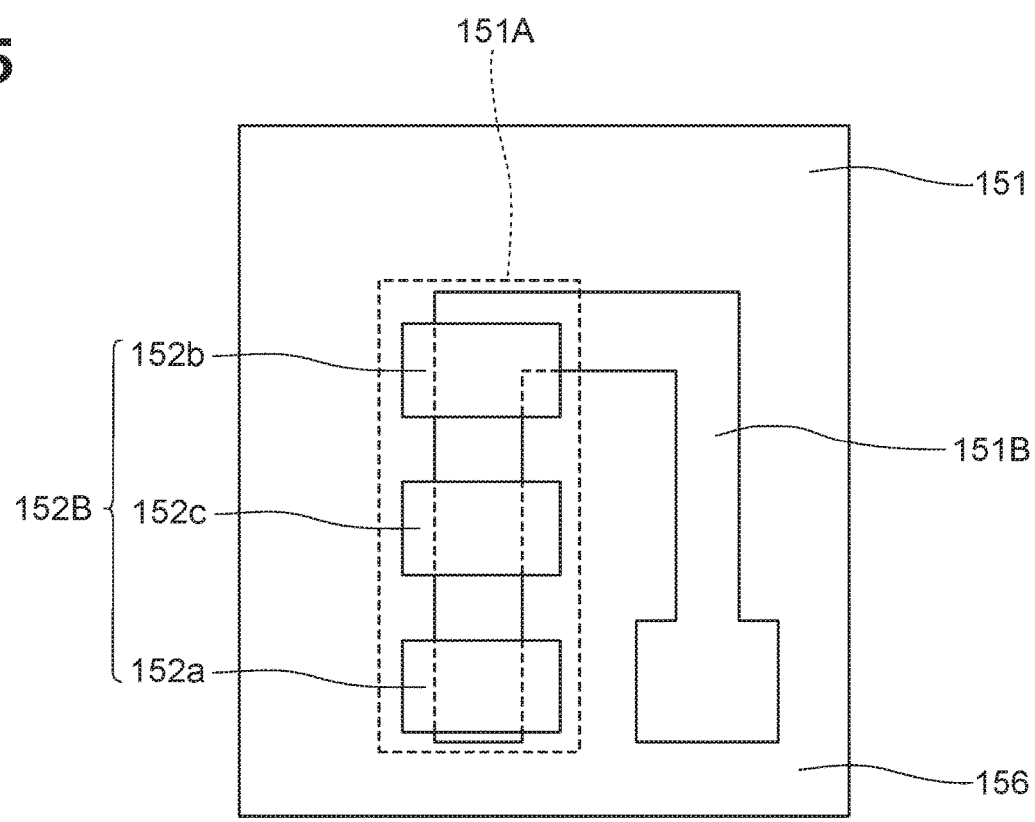
FIG. 15 is a plan view showing the sub-mount according to the modified example 2.

FIG. 15 is a plan view showing the sub-mount 156 according to the modified example 2. The sub-mount 156 is different in that it has the convex parts 152B instead of the convex parts 152, as compared with the above-described the sub-mount 150. Three convex parts 152a, 152b, 152c are assigned to the convex parts 152B. The three convex parts 152a, 152b, 152c are arranged in three points, which both end parts along with the long side direction of the light source-area 151A and the middle point of them. The three convex parts 152a, 152b, 152c, as the convex parts 152B, are also arranged in the light source-area 151A. Therefore, only some parts of the first, second metal-layers 171, 172 are pressed in the heating-push step, similar to the case which the sub-mount 150 is used. Therefore, overflow of the melted solder (the first metal-layer 171, in this embodiment) does not occur.

Modified Example 3

Figure 16:
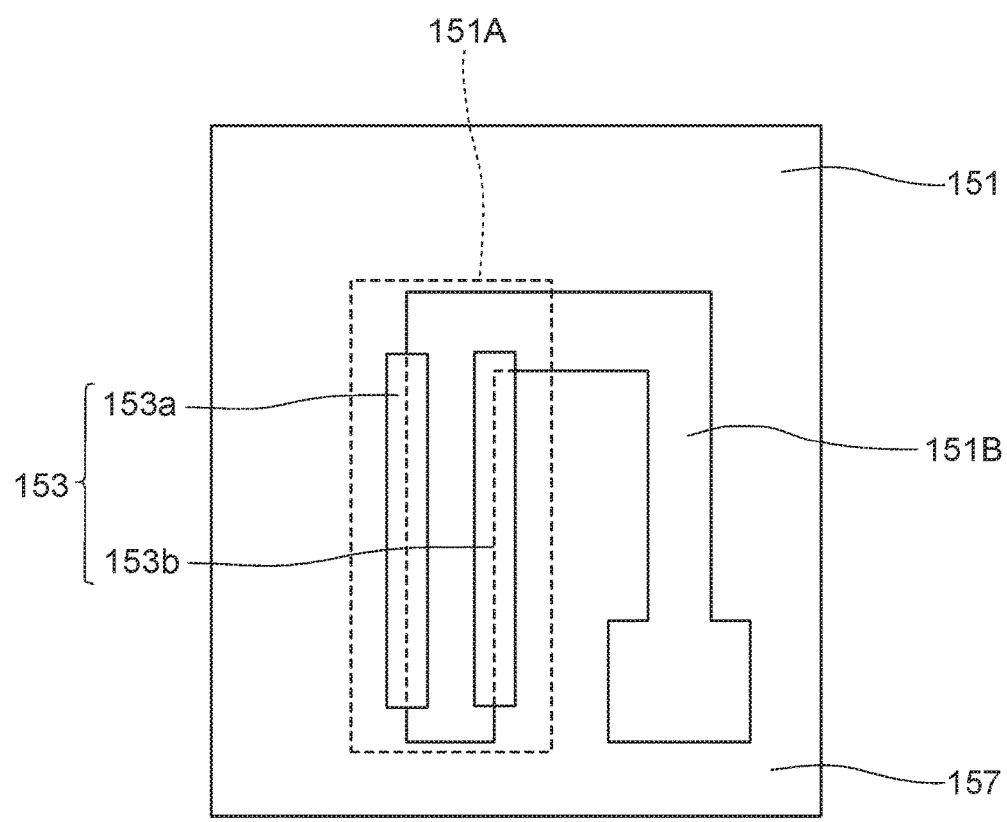
FIG. 16 is a plan view showing the sub-mount according to the modified example 3.

FIG. 16 is a plan view showing the sub-mount 157 according to the modified example 3. The sub-mount 157 is different in that it has the convex parts 153 instead of the convex parts 152, as compared with the above-described the sub-mount 150. Two convex parts 153a, 153b are assigned to the convex parts 153. The two convex parts 153a, 153b have band-like shapes along with the long side direction of the light source-area 151A, and they are arranged in parallel with each other along with the long side direction. The two convex parts 153a, 153b are also arranged in the light source-area 151A. Therefore, only some parts of the first, second metal-layers 171, 172 are pressed in the heating-push step, similar to the case which the sub-mount 150 is used.

Therefore, overflow of the melted solder (the first metal-layer 171, in this embodiment) does not occur.

Modified Example 4

Figure 17:
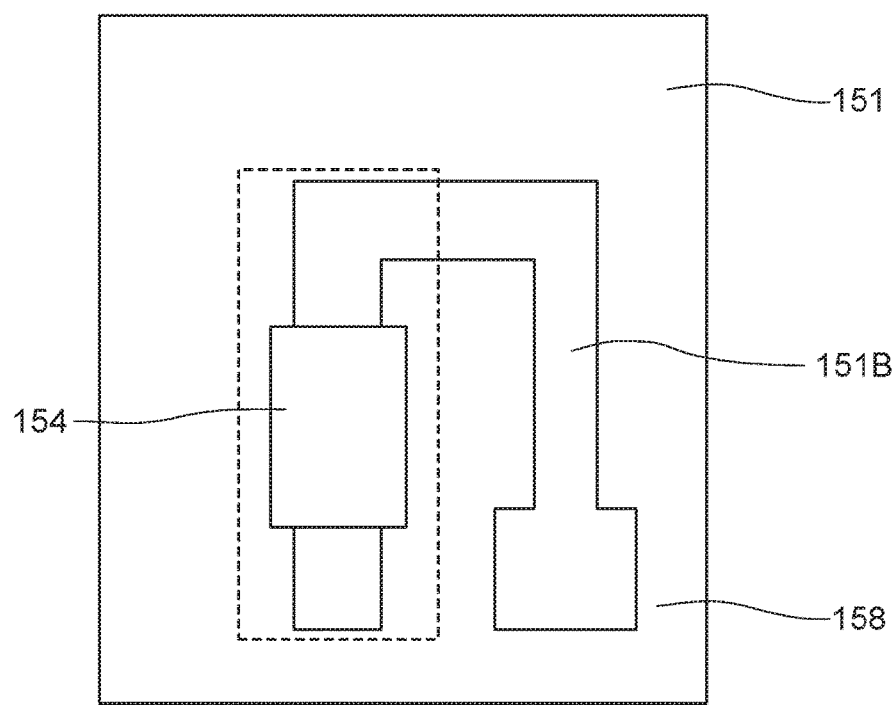
FIG. 17 is a plan view showing the sub-mount according to the modified example 4.

FIG. 17 is a plan view showing the sub-mount 158 according to the modified example 4. The sub-mount 158 is different in that it has the one convex part 154 instead of the convex parts 152 as compared with the above-described the sub-mount 150. The convex part 154 is arranged in the middle along with the long side direction of the light source-area 151A. The convex part 154 has size which the above-described two convex parts 152a, 152b become one body. Therefore, in case of the sub-mount 158, the laser diode 130 is also supported, similar to the case of the sub-mount 150. Furthermore, only some parts of the first, second metal-layers 171, 172 are pressed in the heating-push step. Therefore, overflow of the melted solder (the first metal-layer 171, in this embodiment) does not occur.

Modified Example 5

In case of the above-described embodiment, the sub-mount 150 is a convex part-mount part having the convex parts 152a, 152b. It is possible that the convex parts, similar to the convex parts 152a, 152b, are formed on the opposing-surface 131 of the laser diode 130, instead of the convex parts 152a, 152b on the sub-mount 150. For example, it is possible that the light source-unit is the light source-unit 161 illustrated in FIGS. 18, 19.

Figure 18:
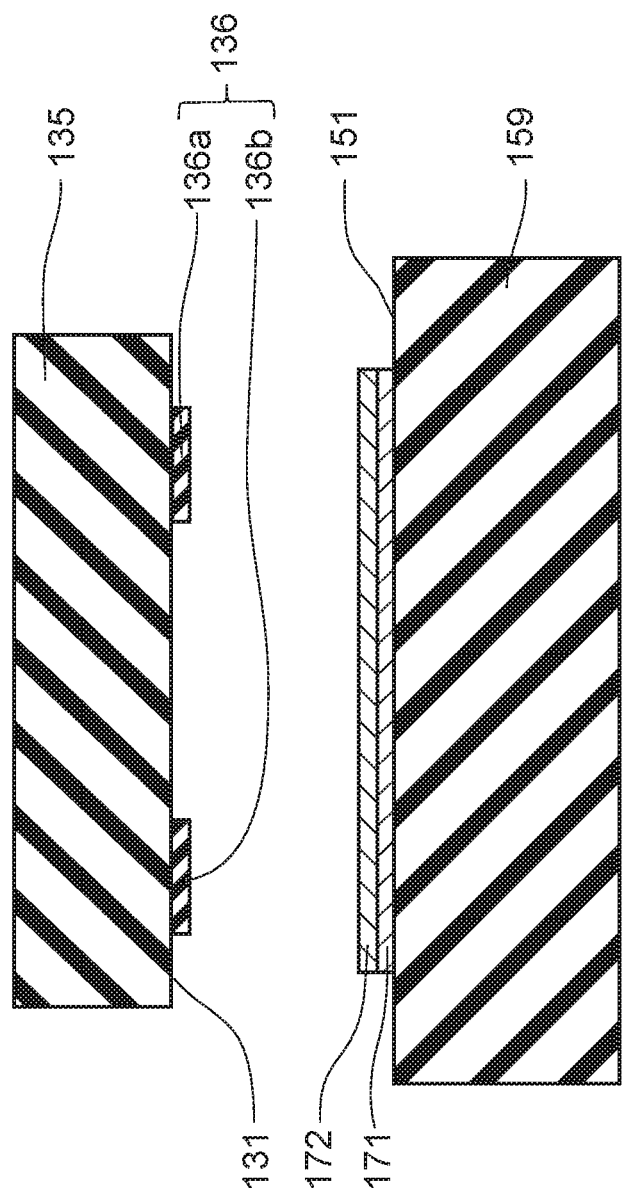
FIG. 18 is a sectional view, similar to FIG. 7, illustrating a manufacturing step of the light source-unit according to the modified example 5.
Figure 19:
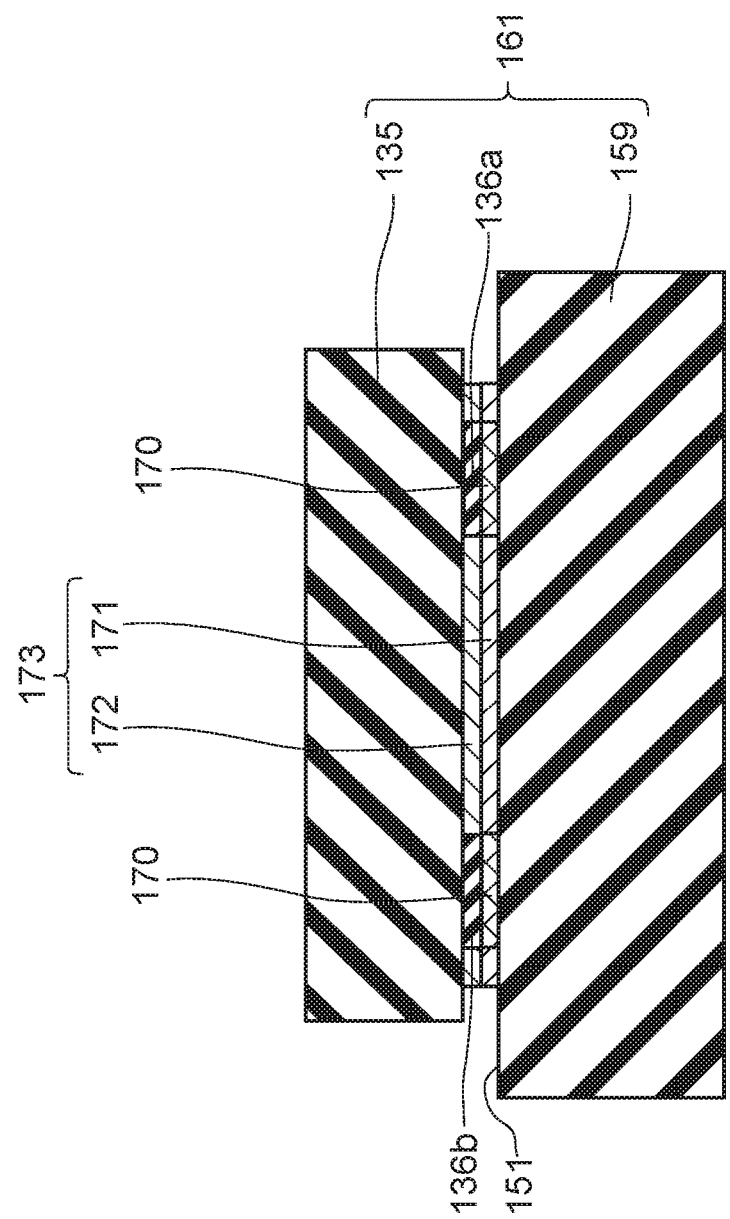
FIG. 19 is a sectional view, similar to FIG. 7, showing the light source-unit according to the modified example 5.

The light source-unit 161 has the laser diode 135, the sub-mount 159, the alloy layer 170 and the laminated metals-layer 173. FIG. 18 is a sectional view, similar to FIG. 7, illustrating the manufacturing step of the light source-unit 161 according to the modified example 5. FIG. 19 is a sectional view, similar to FIG. 7, showing the light source-unit 161.

The laser diode 135 has the opposing-surface 131 and laser convex parts 136 (laser convex parts 136a, 136b), protruding outside from the opposing-surface 131. The laser convex parts 136 (laser convex parts 136a, 136b) are arranged in the light source-area of the joint-surface 151 of the sub-mount 159 (not illustrated in FIG. 19), in FIG. 19. The surfaces of the laser convex parts 136 (laser convex parts 136a, 136b) are formed flat. The alloy layer 170 is formed between the surfaces of the convex parts 136 (laser convex parts 136a, 136b) and the joint-surface 151. The laminated metals-layer 173 is formed on the part between the laser convex part 136a and the laser convex part 136b, in the part between the joint-surface 151 and the opposing-surface 131. The joint-surface 151 of the sub-mount 159 is a flat surface, not having the convex part.

In the light source-unit 161, the sub-mount 159 is not the convex part-mount though, because the laser diode 135 is a convex part-LD, having the laser convex parts 136a, 136b, it has operation and effect similar with the above-described embodiment.

Modified Example 6

In case of the above-described embodiment, the heating-push step is performed until the second concave part 172a vanishes. Therefore, the gap part 174 vanishes after the heating-push step is performed, and the part between the opposing-surface 131 and the joint-surface 151 is filled with the first, second metal-layers 171, 172.

Figure 20:
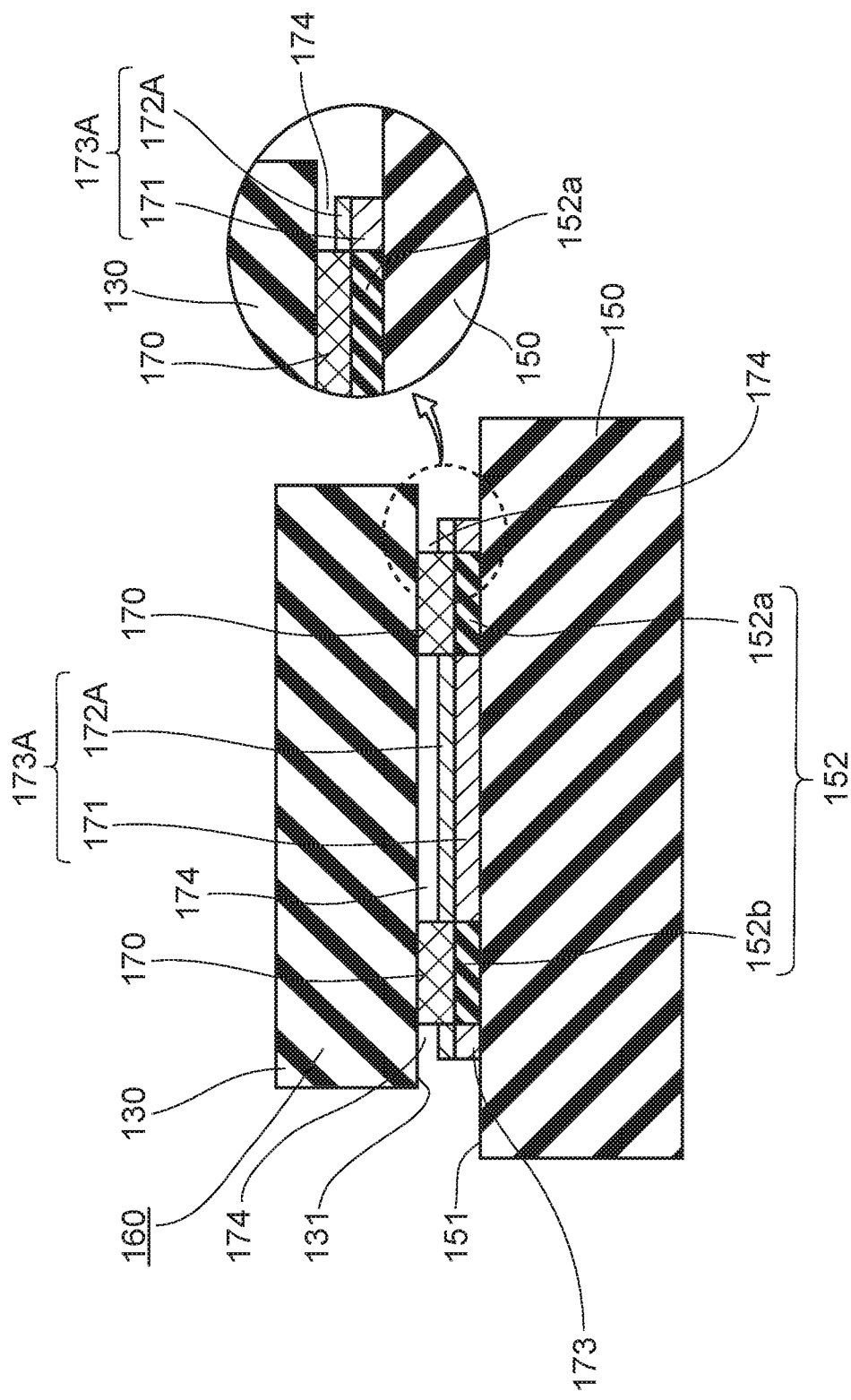
FIG. 20 is a sectional view, similar to FIG. 7, showing the light source-unit according to the modified example 6.

On the other hand, as illustrated in FIG. 20, it is possible that the gap part 174 is left between the opposing-surface 131 and the joint-surface 151. In case of FIG. 20, the alloy layer 170 is formed between the opposing-surface 131 and the joint-surface 151. However, the gap part 174 is left without being filled with the first, second metal-layers 171, 172 between the opposing-surface 131 and the joint-surface 151.

Figure 21:
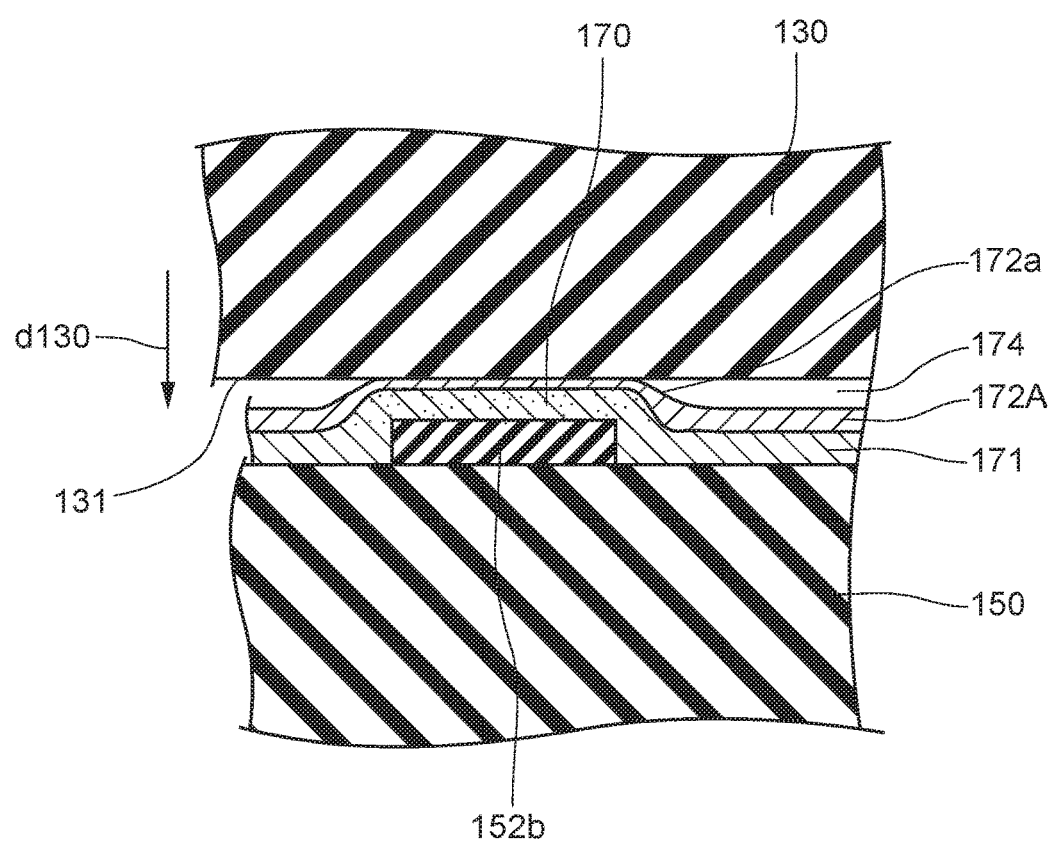
FIG. 21 is a sectional view, similar to FIG. 13, illustrating the manufacturing step of the light source-unit according to the modified example 6.

Then, as illustrated in FIG. 21, the heating-push step of this case is performed so that the second concave part 172a is left. Then, the alloy layer 170 is made from the melted first metal-layer 171, second metal-layer 172A though, the gap part 174 is left. This case has also operation and effect similar with the above-described embodiment.

(Embodiments of Head Gimbal Assembly and Hard Disk Drive)

Next, embodiments of the head gimbal assembly and hard disk drive will now be explained with reference to FIG. 22 to FIG. 23.

Figure 22:
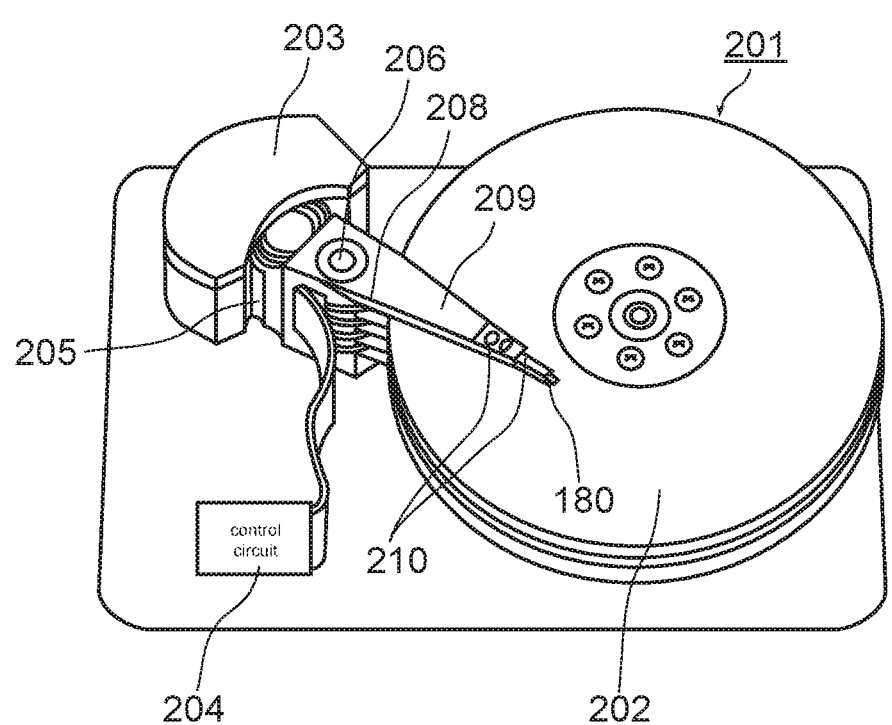
FIG. 22 is a perspective view illustrating a hard disk drive equipped with the thermally assisted magnetic head in FIG. 1.

FIG. 22 is a perspective view showing a hard disk drive 201 equipped with the above-mentioned thermally assisted magnetic head 180. The hard disk drive 201 includes a hard disk (magnetic recording medium) 202 rotating at a high speed and a head gimbal assembly (HGA) 210. The hard disk drive 201 is an apparatus which actuates the HGA 210, so as to record/reproduce data onto/from recording surfaces of the hard disk 202. The hard disk 202 has a plurality of (4 in the drawing) platters. Each platter has a recording surface opposing its corresponding the thermally assisted magnetic head 180.

The hard disk drive 201 positions the slider 120 on a track by an assembly carriage device 203. Further, the hard disk drive 201 has a plurality of drive arms 209. The drive arms pivot about a pivot bearing shaft 206 by means of a voice coil motor (VCM) 205, and are stacked in a direction along the pivot bearing shaft 206. Further, the HGA 210 is attached to the tip of each drive arm.

Further, the hard disk drive 201 has a control circuit 204 controlling recording/reproducing and the generation of light by the laser diode 130.

Figure 23:
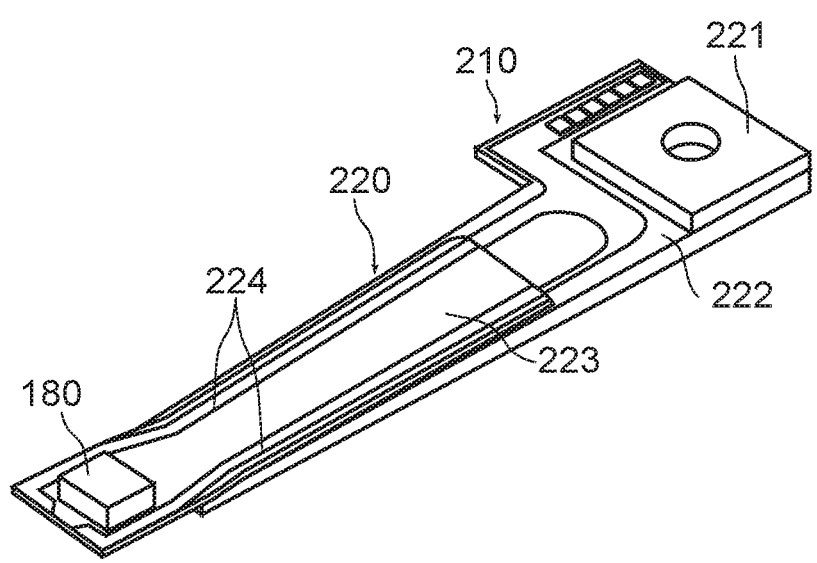
FIG. 23 is a perspective view illustrating a rear side of the HGA.
Figure 24:
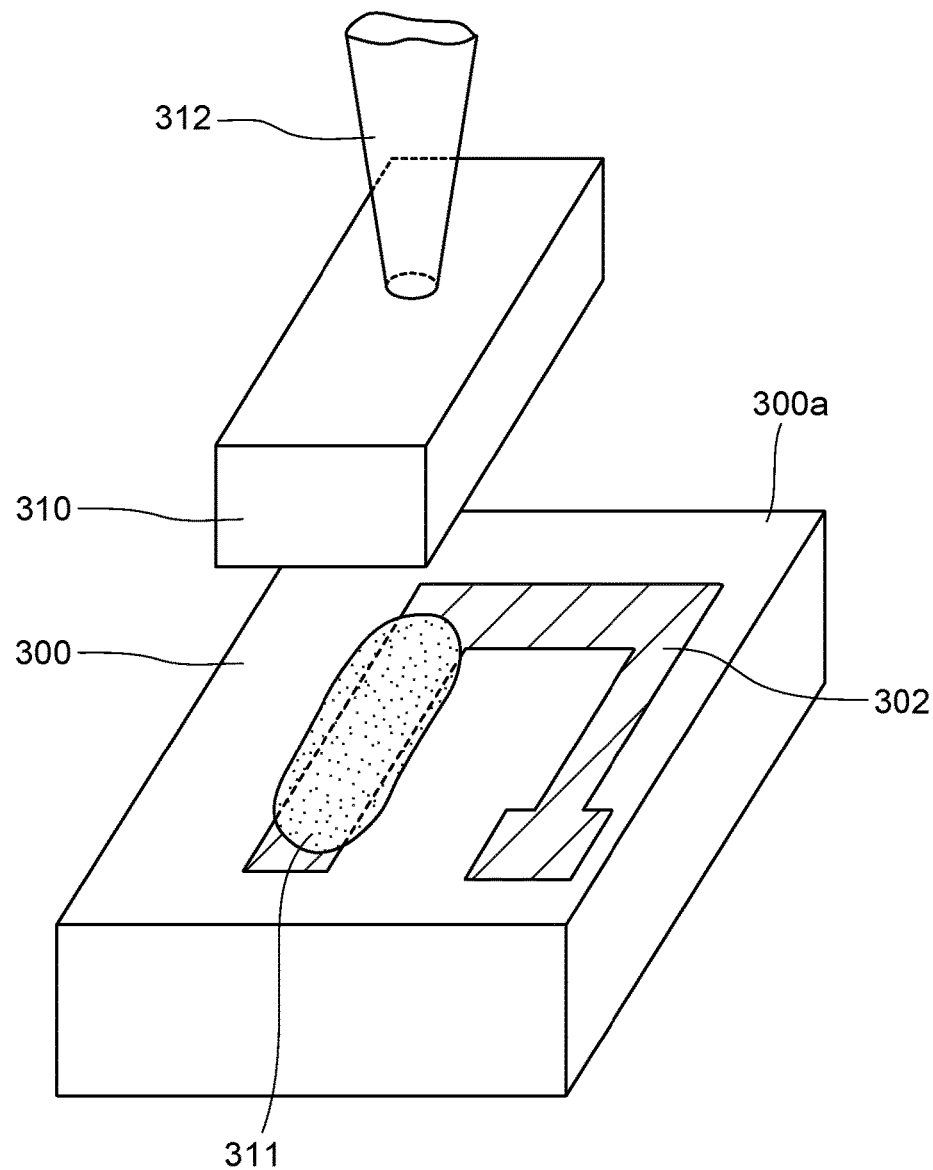
FIG. 24 is a sectional view showing the manufacturing step of the conventional light source-unit.
Figure 25A:
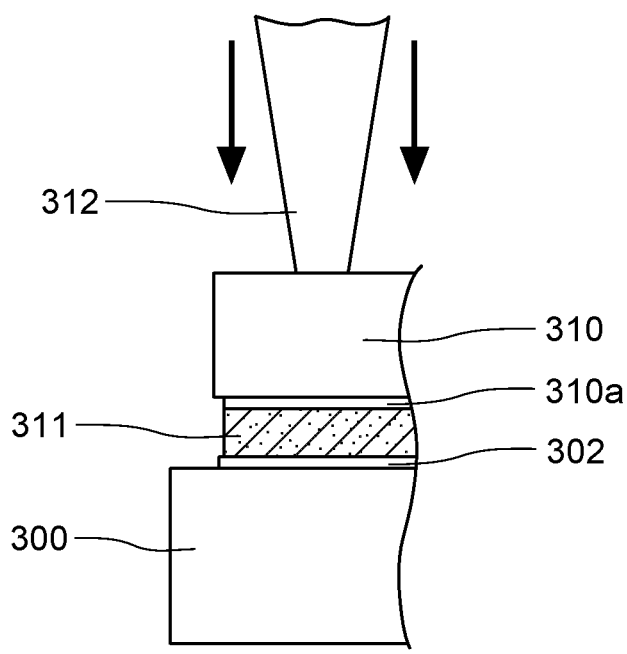
FIG. 25(A) is a sectional view showing the manufacturing step subsequent to that in FIG. 24.
Figure 25B:
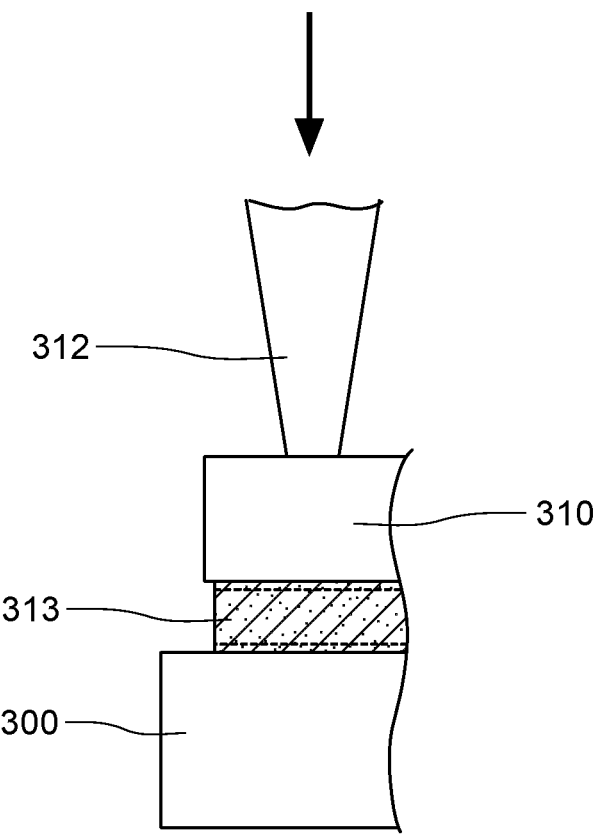
FIG. 25(B) is a sectional view showing the manufacturing step subsequent to that in FIG. 25(A)
Figure 26:
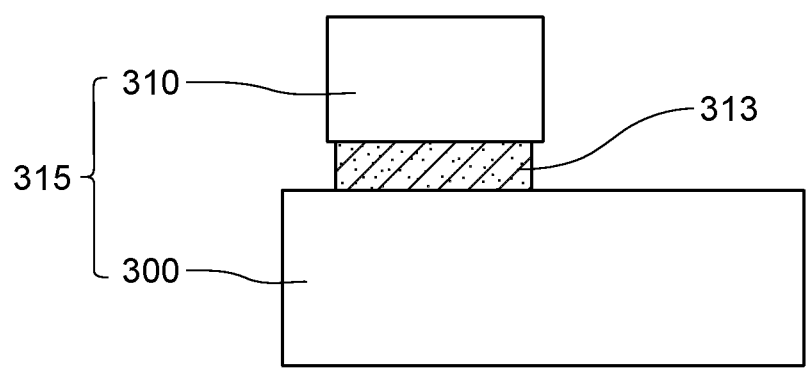
FIG. 26 is a side view illustrating the conventional light source-unit.
Figure 27:
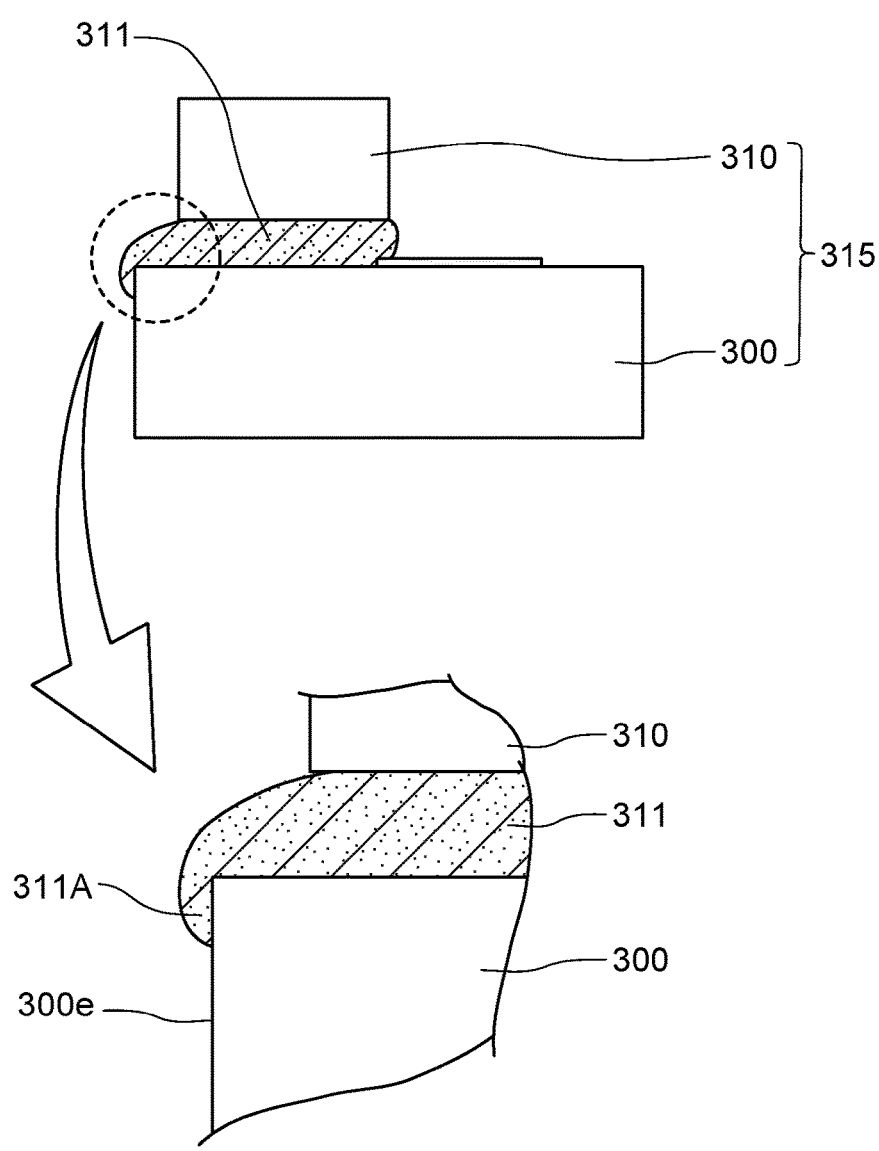
FIG. 27 is a side view illustrating the conventional light source-unit, with the occurrence of overflow.
Figure 28:
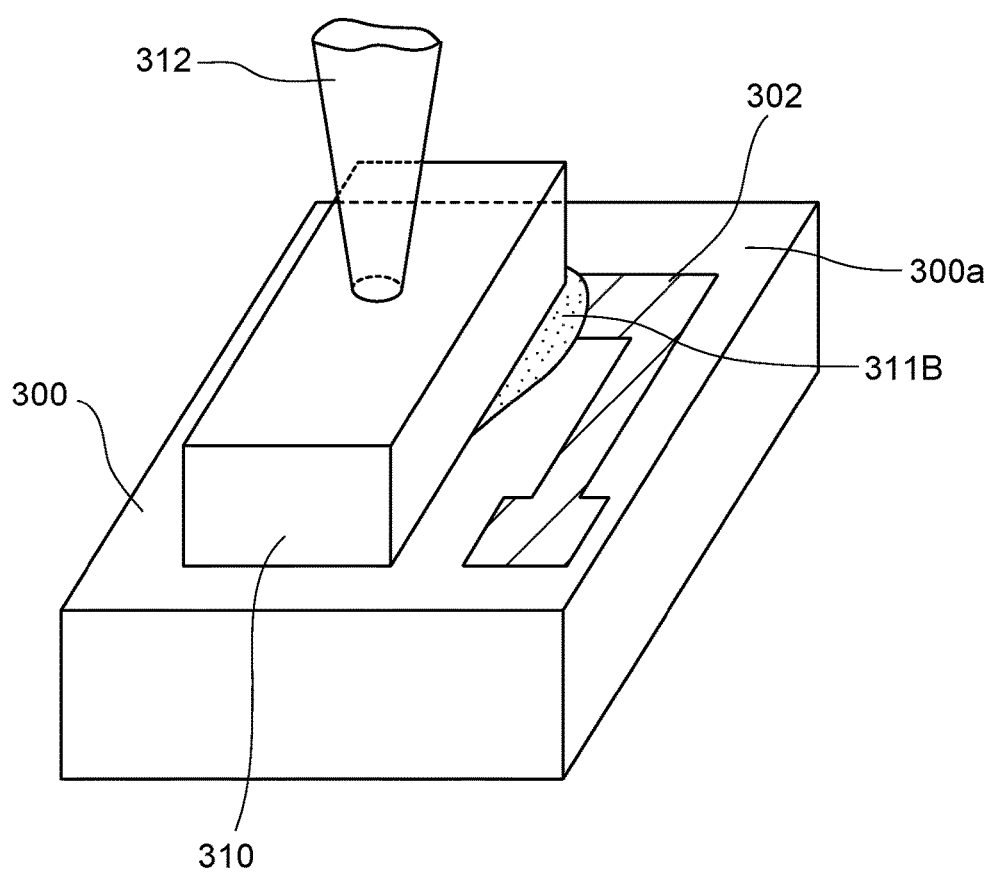
FIG. 28 is a perspective view illustrating the conventional light source-unit, with the other occurrence of overflow.
Figure 29:
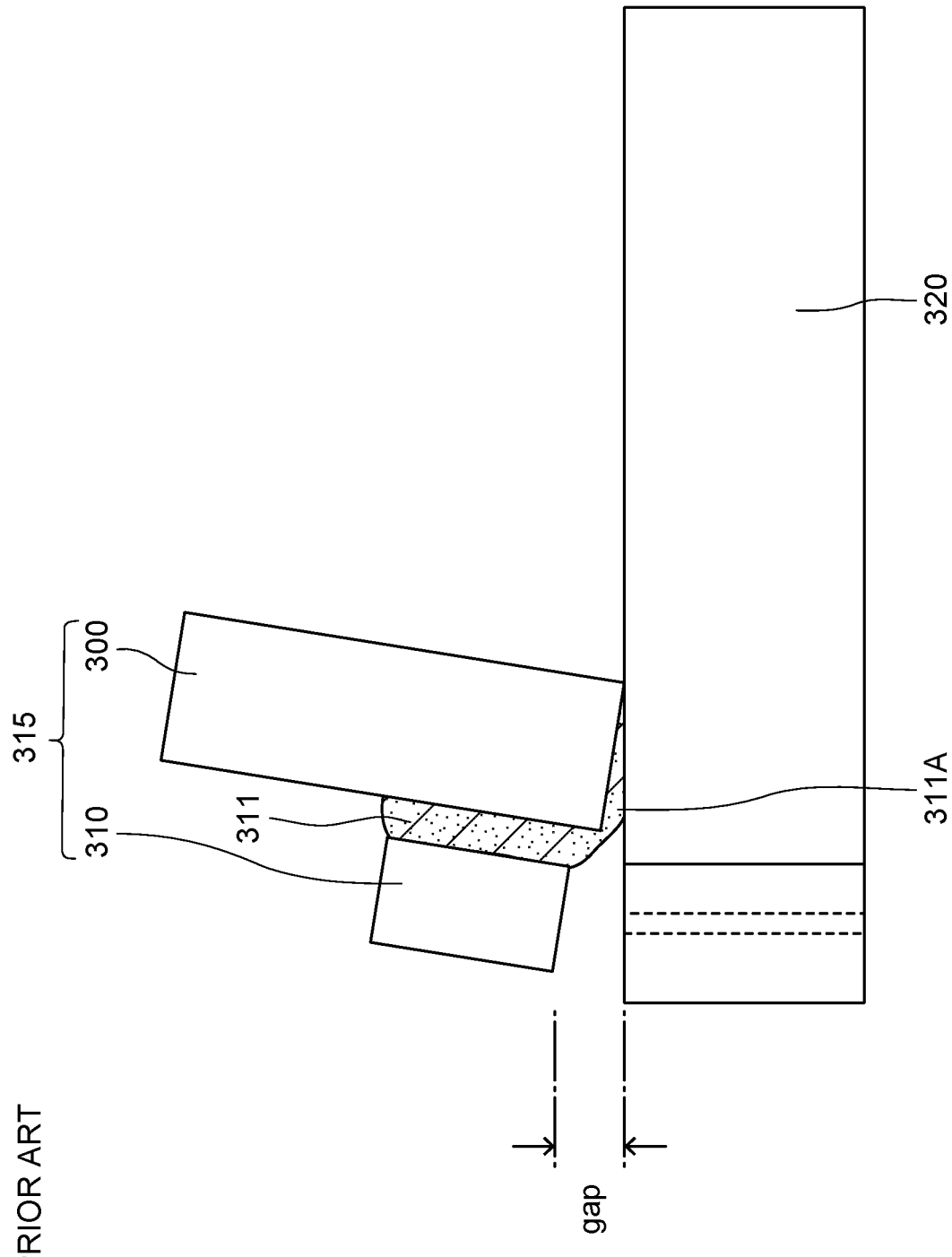
FIG. 29 is a side view illustrating the case which the conventional light source-unit, with the occurrence of overflow in FIG. 27, is joined to the slider.
Figure 30:
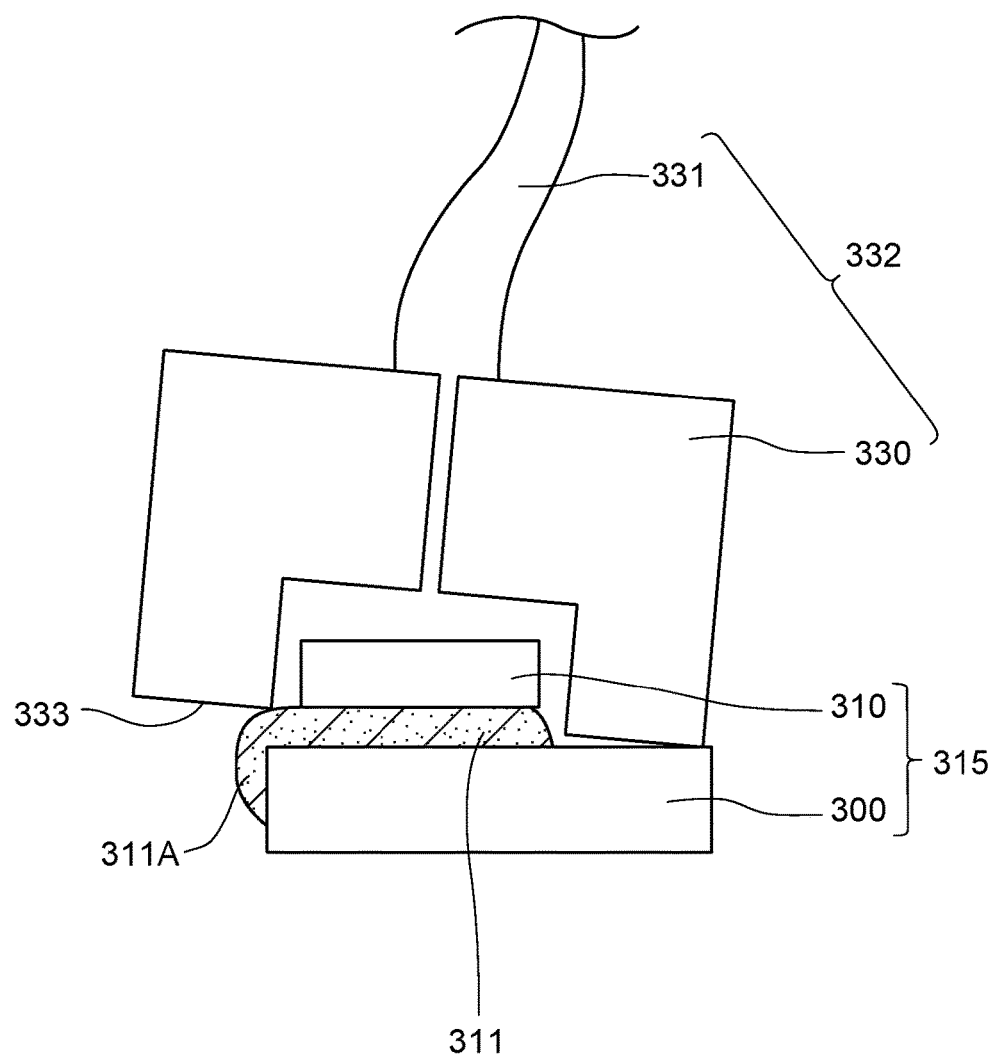
FIG. 30 is a side view illustrating the case which the conventional light source-unit, with the occurrence of overflow in FIG. 27, is picked-up.

FIG. 23 is a perspective view illustrating a rear surface side of the HGA 210. In the HGA 210, the thermally assisted magnetic head 180 is fixed to a tip portion of a suspension 220. Further, in the HGA 210, one end portion of a wiring member 224 is electrically connected to a terminal electrode of the slider 120.

The suspension 220 has a load beam 222, a base plate 221 provided at a base portion of the load beam 222, a flexure 223 fixed to and supported on the load beam 222 from the tip end side to the front side of the base plate 221 and having elasticity, and the wiring member 224. The wiring member 224 has a lead conductor and connection pads electrically connected to both ends of the lead conductor.

In the hard disk drive 201, when the HGA 210 is rotated, the slider 120 moves in a radial direction of the hard disk 202, i.e., a direction traversing track lines.

The aforementioned HGA 210 and hard disk drive 201 have the thermally assisted magnetic head 180, thereby they do not have an overflow of solder, when the light source-unit 160, used for the thermally assisted magnetic head 180, is manufactured. Therefore, the gap is never occurred, and a pick-up failure is also never occurred. Accordingly, the thermally assisted magnetic head 180 is effectively manufactured.

Though the above-mentioned embodiments explain a type in which a thin-film coil is wound like a flat spiral about the main magnetic pole layer by way of example, the present invention is also applicable to a type in which the thin-film coil is wound helically about the main magnetic pole layer.

Further, in the above-described embodiments, the surfaces 152ac, 152bc of the convex parts 152 are formed in a rectangular shape. However, it is possible that the surfaces of the convex parts 152 are formed in another shape such as a circular shape, an elliptic shape, a triangle or the like.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A light source-unit which is used for a thermally assisted magnetic head comprising:
   a laser diode; and
   a sub-mount which the laser diode is joined;
   wherein the sub-mount comprises a joint-surface which the laser diode is joined; and a convex part protruding from the joint-surface,
   wherein the light source-unit comprises an alloy layer, made of alloy, which is formed between the surface of the convex part and an opposing-surface, of the laser diode, opposing to the joint-surface,
   wherein the opposing-surface is a flat surface with no unevenness, and the alloy layer is formed flatly without unevenness.

2. A light source-unit which is used for a thermally assisted magnetic head comprising:
   a laser diode; and
   a sub-mount which the laser diode is joined;
   wherein the sub-mount comprises a joint-surface which the laser diode is joined; and a convex part protruding from the joint-surface,
   wherein the light source-unit comprises an alloy layer, made of alloy, which is formed between the surface of the convex part and an opposing-surface, of the laser diode, opposing to the joint-surface,
   wherein the light source-unit further comprising:
   a laminated metals-layer formed between the joint-surface and the opposing-surface;
   wherein the laminated metals-layer has a first metal-layer formed with alloy including tin and a second metal-layer formed with alloy which is different from the first metal-layer.

3. The light source-unit according to claim 2,
   wherein the convex part and the alloy layer has thickness in common with the laminated metals-layer.

4. The light source-unit according to claim 2,
   wherein the sub-mount has plural convex parts, formed in a light source-area, of the joint-surface, which the laser diode is arranged, as the convex part,
   wherein the laminated metals-layer is formed between each of the plural convex parts.

5. The light source-unit according to claim 4,
   wherein each of the plural convex parts is arranged both sides of the light source-area along with the long side direction.

6. The light source-unit according to claim 4,
   wherein the plural convex parts are formed so that an add-up size, which the size of each convex part formed in the light source-area is added, is smaller than the size of the opposing-surface.

7. The light source-unit according to claim 1,
wherein the alloy layer is made of AuSn alloy including Au and tin.

8. The light source-unit according to claim 1,
wherein the convex part is formed so that the surface is formed flat along with the joint-surface.

9. A light source-unit which is used for a thermally assisted magnetic head comprising:
a laser diode; and
a sub-mount which the laser diode is joined;
wherein the sub-mount comprises a joint-surface which the laser diode is joined;
wherein the laser diode comprises an opposing-surface opposing to the joint-surface and a laser convex part protruding from the opposing surface,
wherein the light source-unit comprises an alloy layer, made of alloy, which is formed between the surface of the laser convex part and the joint-surface of the sub-mount,
wherein the joint-surface is a flat surface with no unevenness, and the alloy layer is formed flatly without unevenness.

10. The light source-unit according to claim 9,
wherein the laser convex part is formed in a light source-area, of the joint-surface, which the laser diode is arranged.

11. A light source-unit which is used for a thermally assisted magnetic head comprising:
a laser diode; and
a sub-mount which the laser diode is joined;
wherein the sub-mount comprises a joint-surface which the laser diode is joined;
wherein the laser diode comprises an opposing-surface opposing to the joint-surface and a laser convex part protruding from the opposing surface,
wherein the light source-unit comprises an alloy layer, made of alloy, which is formed between the surface of the laser convex part and the joint-surface of the sub-mount,
wherein the laser diode has plural laser convex parts, formed in the opposing-surface, as the laser convex part,
wherein the light source-unit further comprising:
a laminated metals-layer formed between the joint-surface and the opposing-surface;
wherein the laminated metals-layer has a first metal-layer formed with alloy including tin and a second metal-layer formed with alloy which is different from the first metal-layer.

12. A thermally assisted magnetic head comprising:
a slider; and
a light source-unit joined to the slider,
wherein the light source-unit comprises a laser diode and a sub-mount which the laser diode is joined;
wherein the sub-mount comprises a joint-surface which the laser diode is joined; and a convex part protruding from the joint-surface,
wherein the light source-unit comprises an alloy layer, made of alloy, which is formed between the surface of the convex part and an opposing-surface, of the laser diode, opposing to the joint-surface,
wherein the opposing-surface is a flat surface with no unevenness, and the alloy layer is formed flatly without unevenness.

13. A thermally assisted magnetic head comprising:
a slider; and
a light source-unit joined to the slider,
wherein the light source-unit comprises a laser diode and a sub-mount which the laser diode is joined;
wherein the sub-mount comprises a joint-surface which the laser diode is joined; and a convex part protruding from the joint-surface,
wherein the light source-unit comprises an alloy layer, made of alloy, which is formed between the surface of the convex part and an opposing-surface, of the laser diode, opposing to the joint-surface,
wherein the light source-unit further comprising:
a laminated metals-layer formed between the joint-surface and the opposing-surface;
wherein the laminated metals-layer has a first metal-layer formed with alloy including tin and a second metal-layer formed with alloy which is different from the first metal-layer.

14. A head gimbal assembly comprising a thermally assisted magnetic head,
wherein the thermally assisted magnetic head comprising:
a slider; and
a light source-unit joined to the slider,
wherein the light source-unit comprises a laser diode and a sub-mount which the laser diode is joined;
wherein the sub-mount comprises a joint-surface which the laser diode is joined; and a convex part protruding from the joint-surface,
wherein the light source-unit comprises an alloy layer, made of alloy, which is formed between the surface of the convex part and an opposing-surface, of the laser diode, opposing to the joint-surface,
wherein the opposing-surface is a flat surface with no unevenness, and the alloy layer is formed flatly without unevenness.

15. A hard disk drive comprising a head gimbal assembly having a thermally assisted magnetic head, and a magnetic recording medium opposing the thermally assisted magnetic head,
wherein the thermally assisted magnetic head comprising:
a slider; and
a light source-unit joined to the slider,
wherein the light source-unit comprises a laser diode and a sub-mount which the laser diode is joined;
wherein the sub-mount comprises a joint-surface which the laser diode is joined; and a convex part protruding from the joint-surface,
wherein the light source-unit comprises an alloy layer, made of alloy, which is formed between the surface of the convex part and an opposing-surface, of the laser diode, opposing to the joint-surface,
wherein the opposing-surface is a flat surface with no unevenness, and the alloy layer is formed flatly without unevenness.

* * * * *